(12) United States Patent
Takada et al.

(10) Patent No.: US 9,307,686 B2
(45) Date of Patent: Apr. 5, 2016

(54) ELECTRONIC COMPONENT AND ELECTRONIC COMPONENT ASSEMBLY APPARATUS

(75) Inventors: Katsumi Takada, Kawasaki (JP);
Kiyokazu Moriizumi, Kawasaki (JP);
Masayuki Itoh, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 102 days.

(21) Appl. No.: 13/420,131

(22) Filed: Mar. 14, 2012

(65) Prior Publication Data
US 2012/0275128 A1 Nov. 1, 2012

(30) Foreign Application Priority Data
Mar. 16, 2011 (JP) ................................. 2011-058364

(51) Int. Cl.
| H05K 13/04 | (2006.01) |
| H05K 1/02 | (2006.01) |
| H05K 3/34 | (2006.01) |
| H01L 23/36 | (2006.01) |
| H01L 23/00 | (2006.01) |
| H01L 23/34 | (2006.01) |
| H01L 23/373 | (2006.01) |
| H05K 3/22 | (2006.01) |

(52) U.S. Cl.
CPC .......... *H05K 13/0465* (2013.01); *H05K 1/0212* (2013.01); *H05K 3/3494* (2013.01); *H05K 13/0486* (2013.01); *H01L 23/345* (2013.01); *H01L 23/36* (2013.01); *H01L 23/3735* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 2224/13111* (2013.01); *H01L 2224/13116* (2013.01); *H01L 2224/13144* (2013.01); *H01L 2224/16225* (2013.01); *H01L 2224/16238* (2013.01); *H01L 2224/29111* (2013.01); *H01L 2224/29116* (2013.01); *H01L 2224/29144* (2013.01); *H01L 2224/32238* (2013.01); *H01L 2224/45144* (2013.01); *H01L 2224/45147* (2013.01); *H01L 2224/48091* (2013.01); *H01L 2224/48105* (2013.01); *H01L 2224/48227* (2013.01); *H01L 2224/81444* (2013.01); *H01L 2224/83444* (2013.01); *H01L 2924/0001* (2013.01); *H01L 2924/01015* (2013.01); *H01L 2924/01047* (2013.01); *H01L 2924/12041* (2013.01); *H01L 2924/1517* (2013.01); *H01L 2924/1579* (2013.01); *H01L 2924/15311* (2013.01); *H01L 2924/181* (2013.01); *H05K 3/22* (2013.01); *H05K 2201/09263* (2013.01); *H05K 2203/1115* (2013.01); *H05K 2203/176* (2013.01); *Y10T 29/53174* (2015.01)

(58) Field of Classification Search
USPC ............ 361/748, 760, 77; 174/52.4, 250–268
See application file for complete search history.

(56) References Cited

U.S. PATENT DOCUMENTS

| 5,624,750 | A * | 4/1997 | Martinez | ............... | B29C 65/342 156/273.9 |
| 5,783,865 | A * | 7/1998 | Higashiguchi | .......... | H01L 23/13 257/774 |
| 6,031,729 | A * | 2/2000 | Berkely | ................ | H01L 23/345 219/209 |
| 2004/0035840 | A1 * | 2/2004 | Koopmans | ............ | H01L 23/345 219/209 |
| 2004/0150116 | A1 * | 8/2004 | Wang | ...................... | H01L 23/36 257/777 |
| 2005/0224955 | A1 * | 10/2005 | Desai | .................. | H01L 23/3128 257/706 |
| 2007/0029108 | A1 * | 2/2007 | Nakao | .................... | B23K 1/085 174/260 |
| 2009/0324241 | A1 * | 12/2009 | Vogley | ............... | G02B 6/12004 398/141 |
| 2010/0246149 | A1 * | 9/2010 | Nakashima | ............. | H01L 23/50 361/767 |
| 2011/0239456 | A1 * | 10/2011 | Conn | ................... | H05K 3/3436 29/840 |
| 2011/0298110 | A1 * | 12/2011 | Pagaila | ................. | H05K 1/186 257/660 |
| 2012/0001200 | A1 * | 1/2012 | Ikoshi | ................... | H01L 23/295 257/77 |

FOREIGN PATENT DOCUMENTS

| JP | 61-148830 | 7/1986 |
| JP | 10-284820 A | 10/1998 |
| JP | 11-087906 A | 3/1999 |

* cited by examiner

Primary Examiner — Zachary M Pape
Assistant Examiner — Douglas Burtner
(74) Attorney, Agent, or Firm — Squire Patton Boggs (US) LLP

(57) ABSTRACT

An electronic component includes a wiring substrate having a first surface and a second surface, an electronic component body mounted on a first surface side of the wiring substrate, an external electrode formed on a second surface side of the wiring substrate which is opposite to the first surface side, the external electrode being electrically connected to the electronic component body, a heat generating member having a conductive property and having a higher resistivity than the external electrode, and a heat insulating layer disposed between the electronic component body and the heat generating member, the heat insulating layer having an insulating property and being formed of a material different from an other material of the wiring substrate.

7 Claims, 28 Drawing Sheets

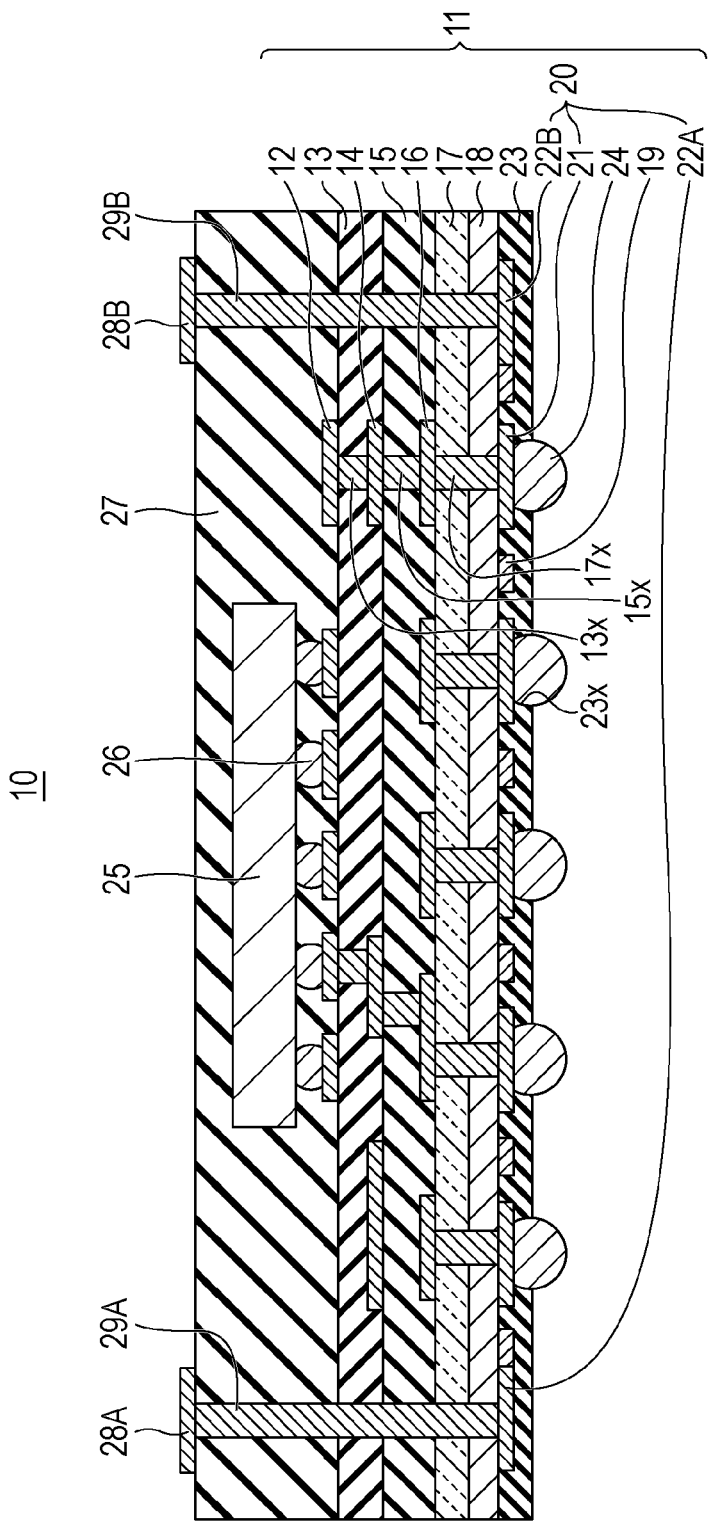

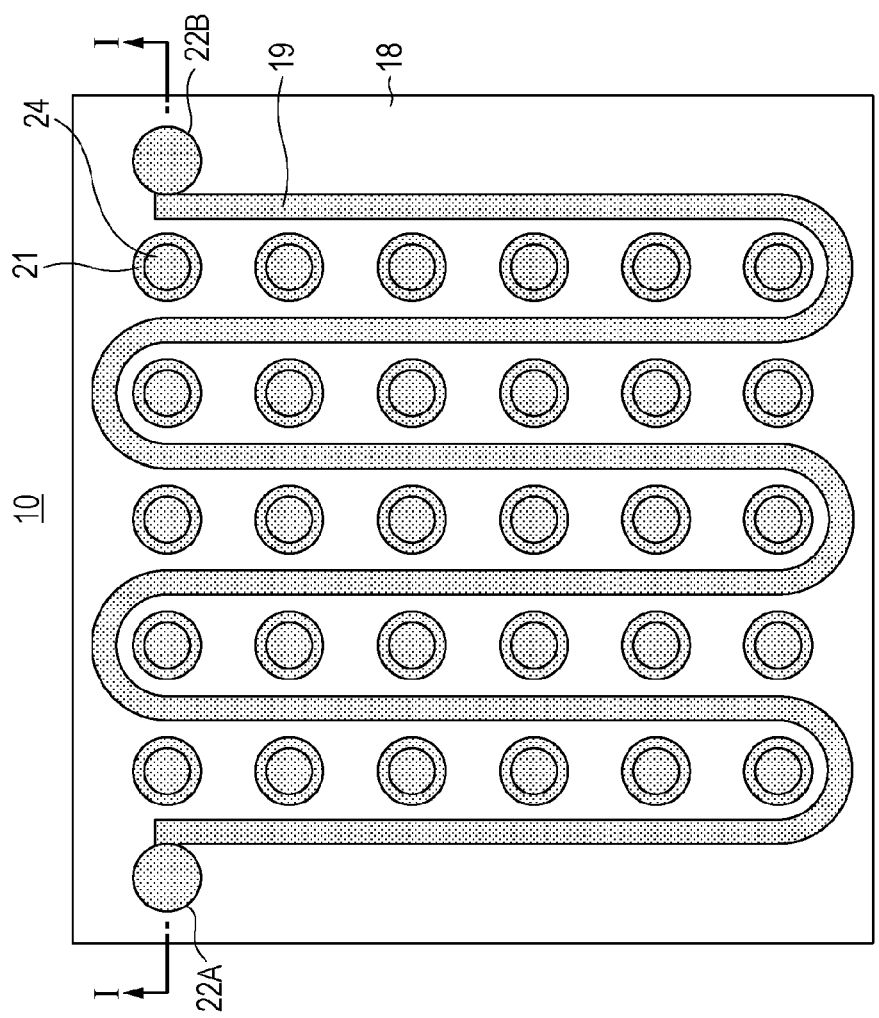

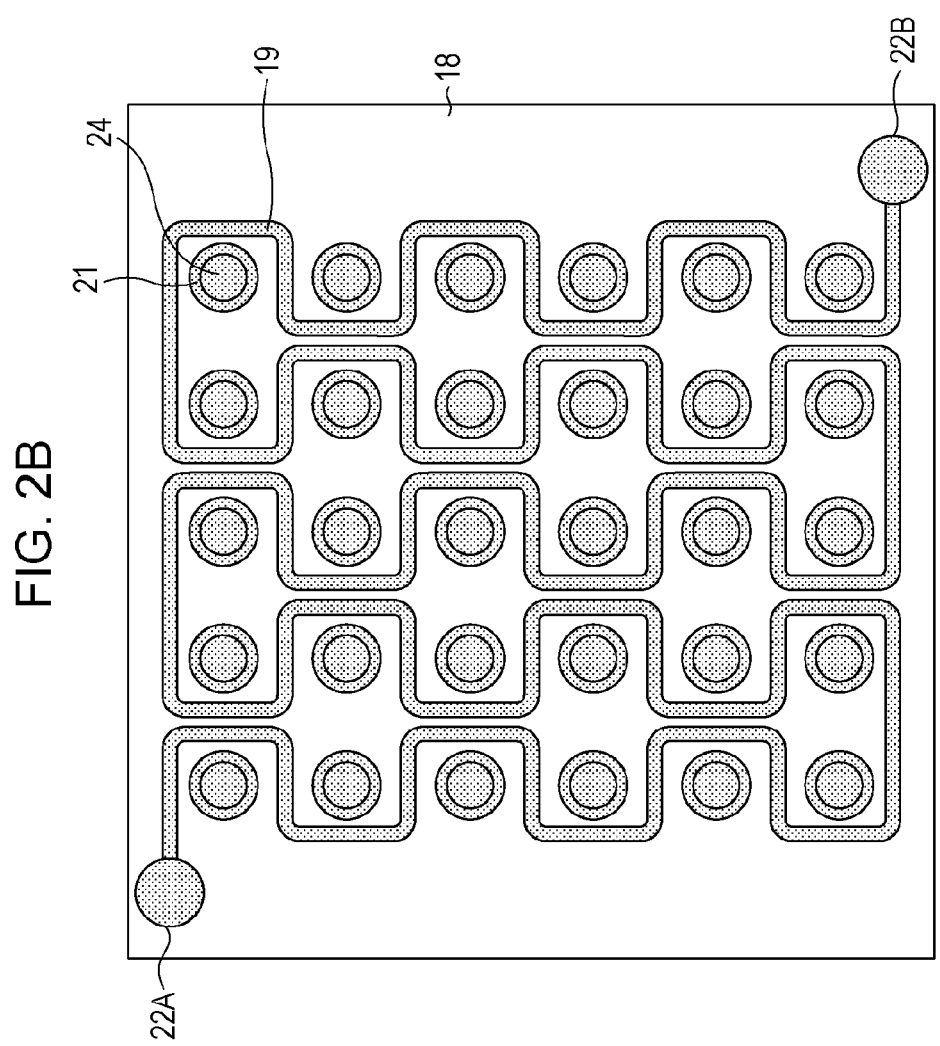

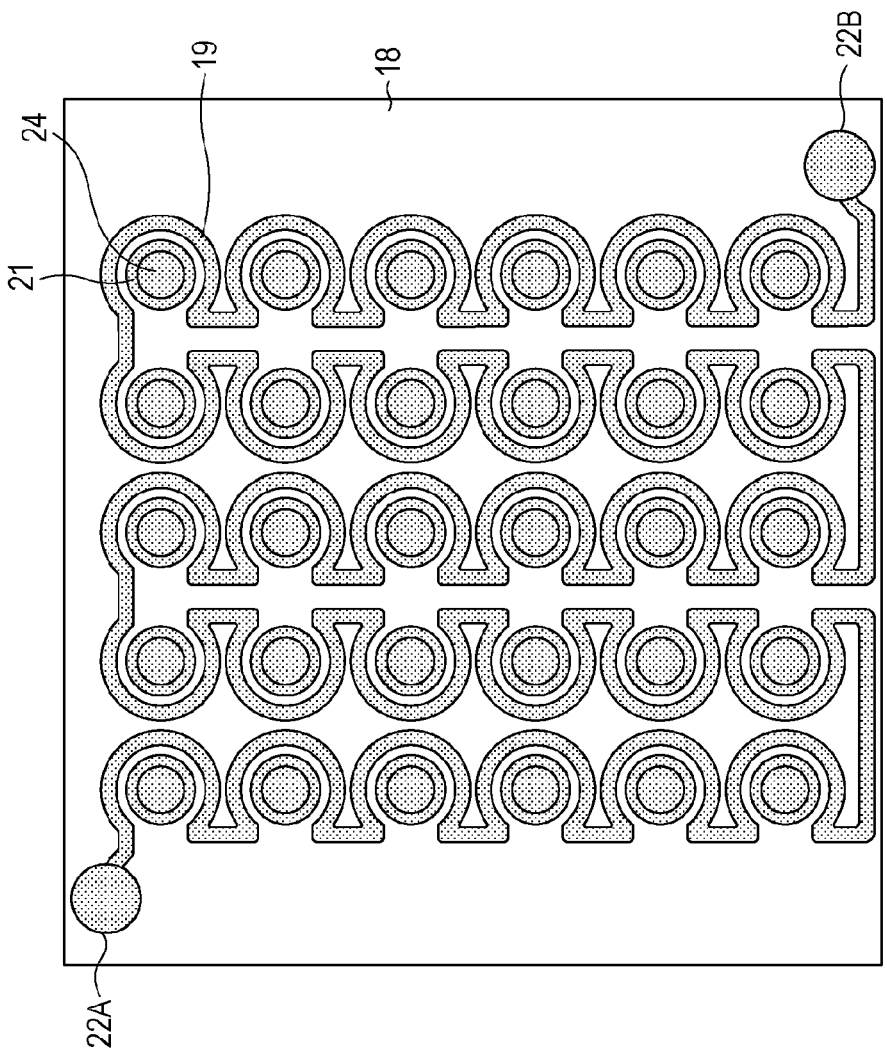

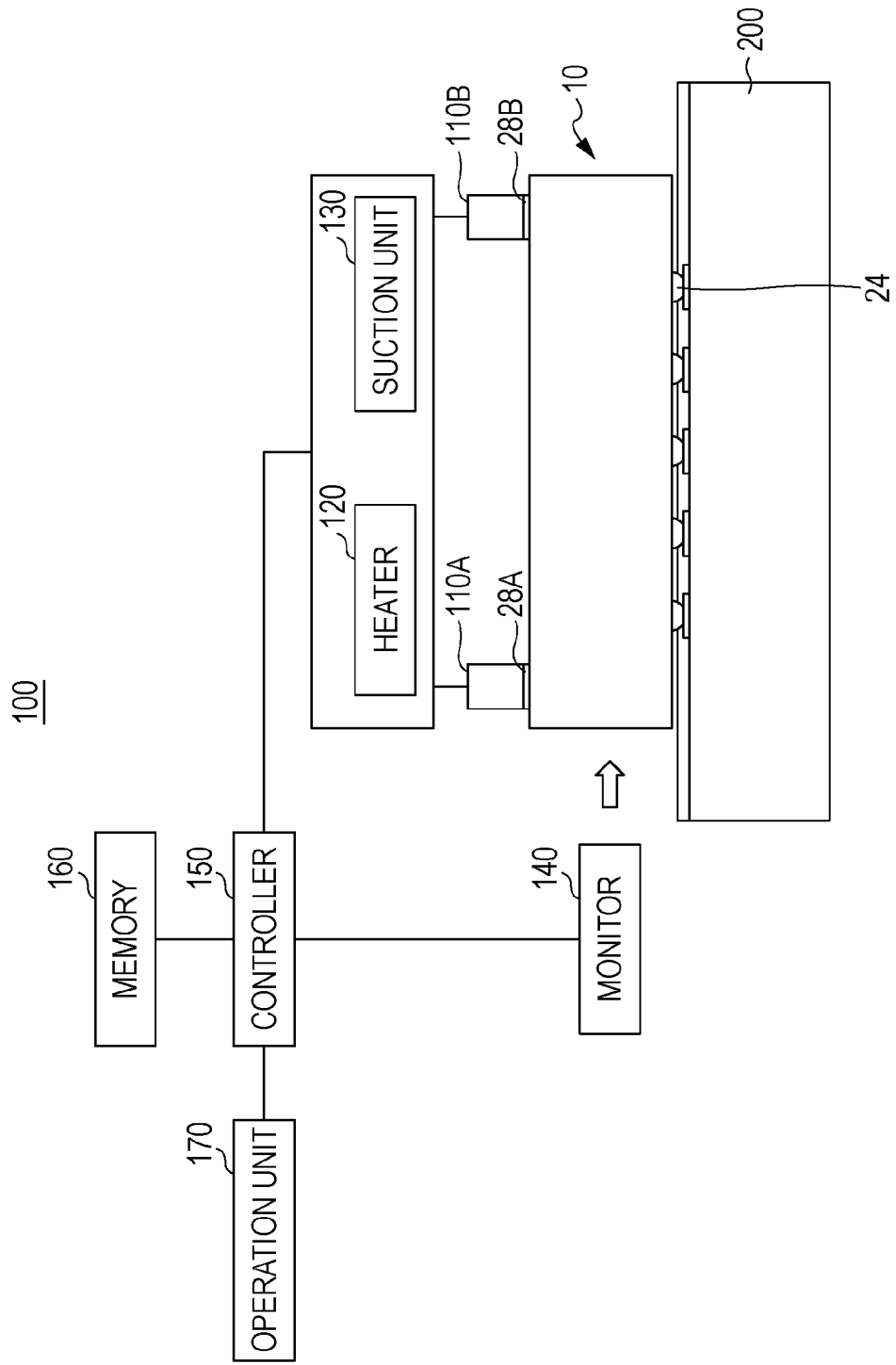

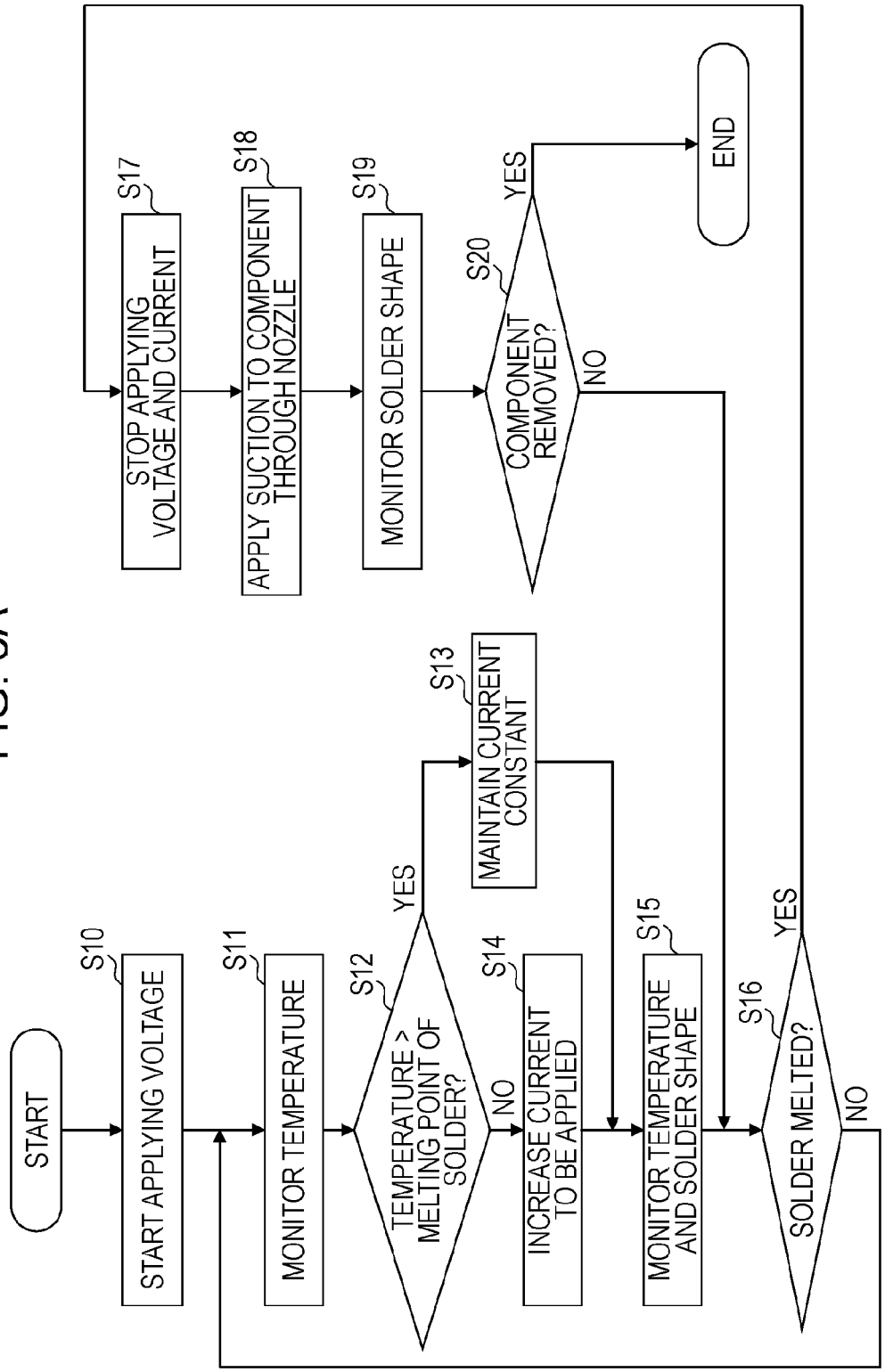

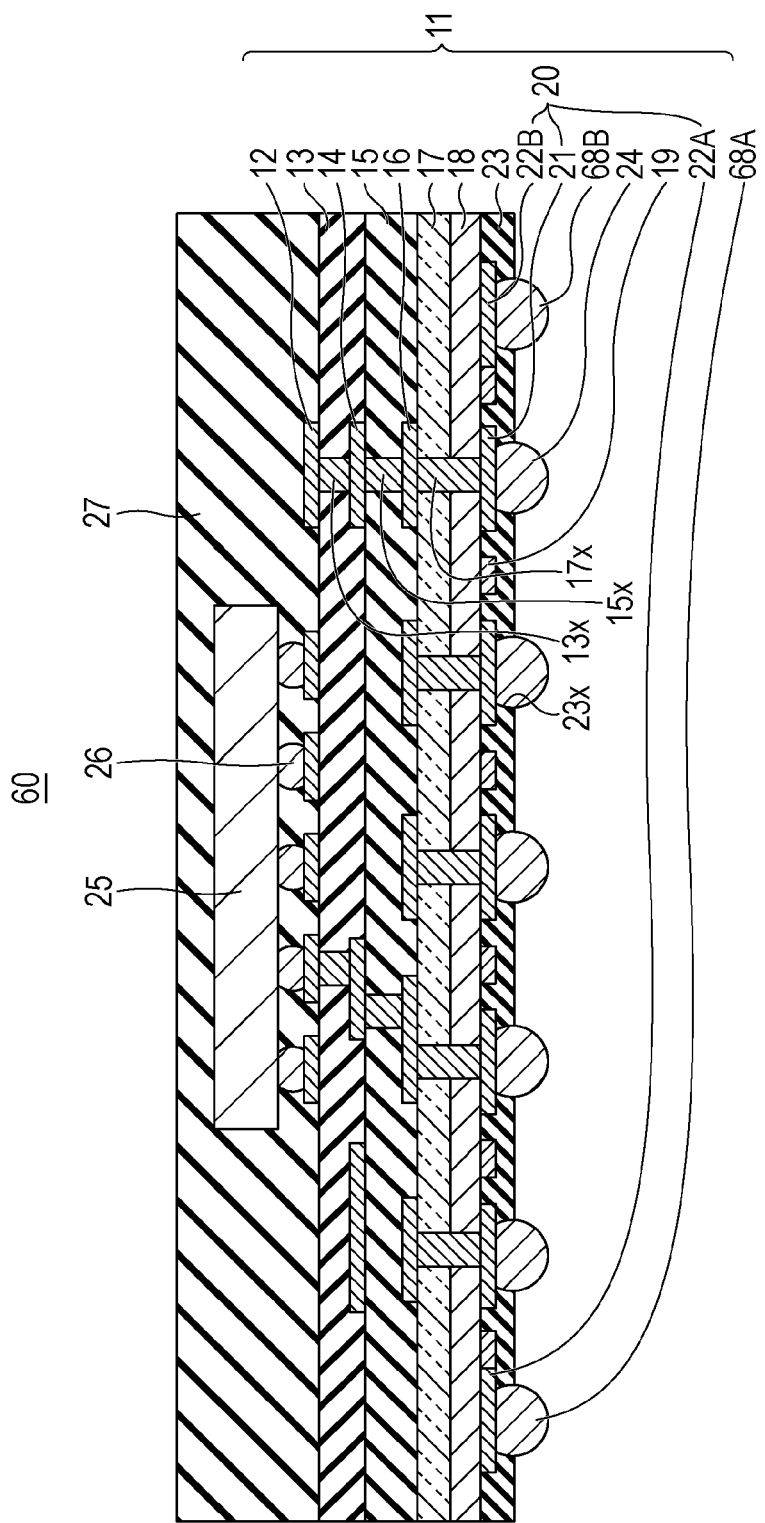

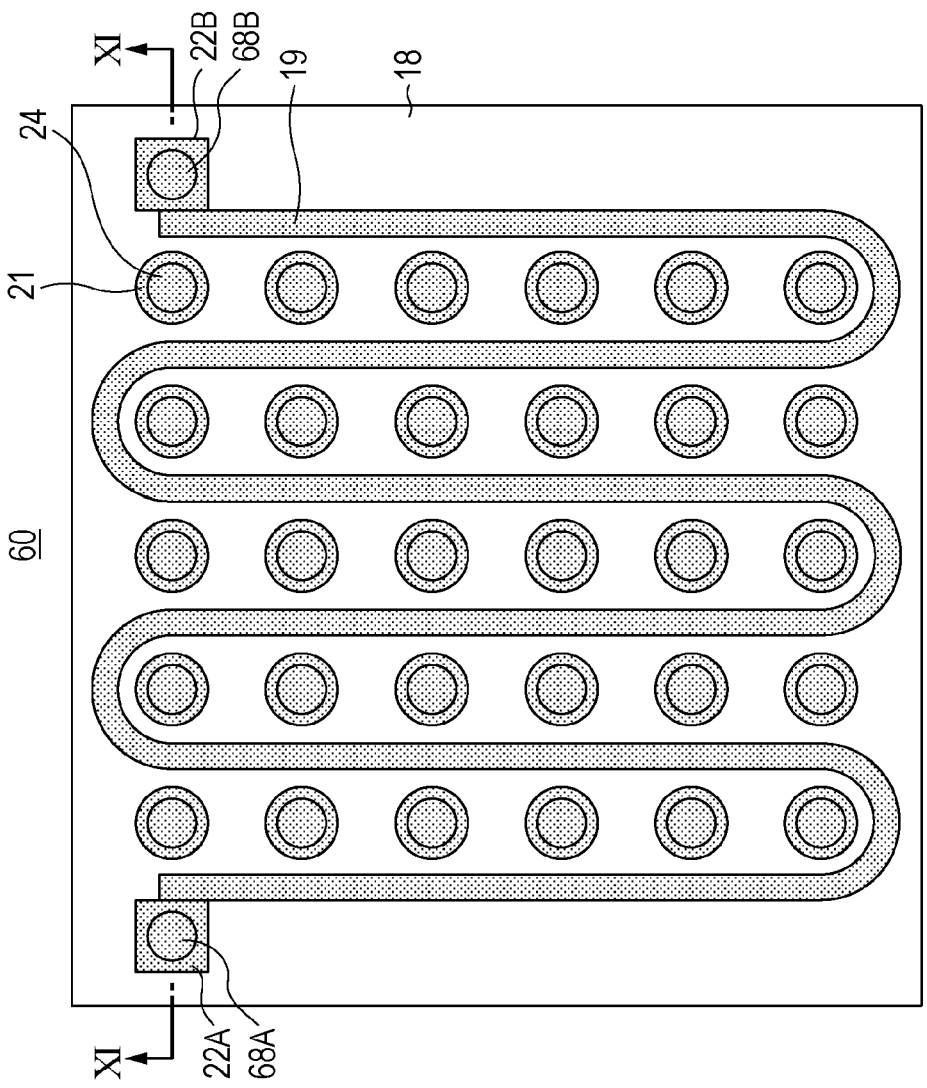

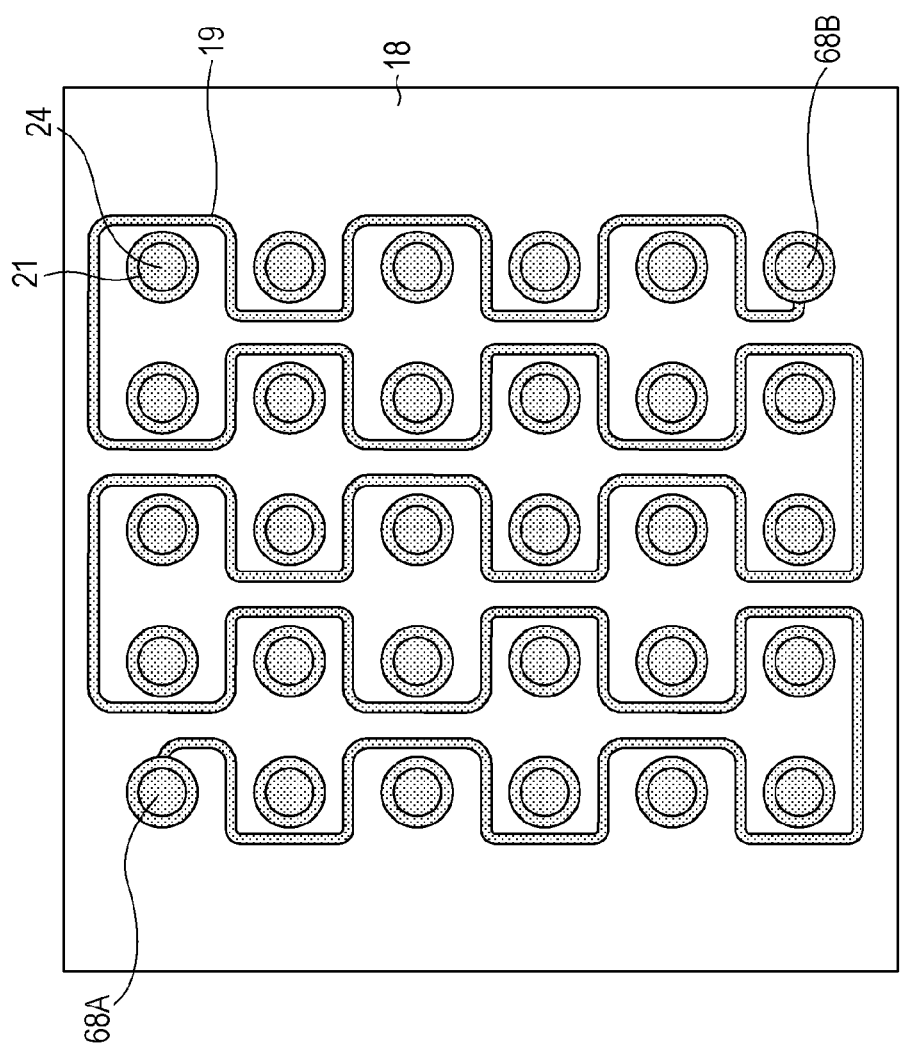

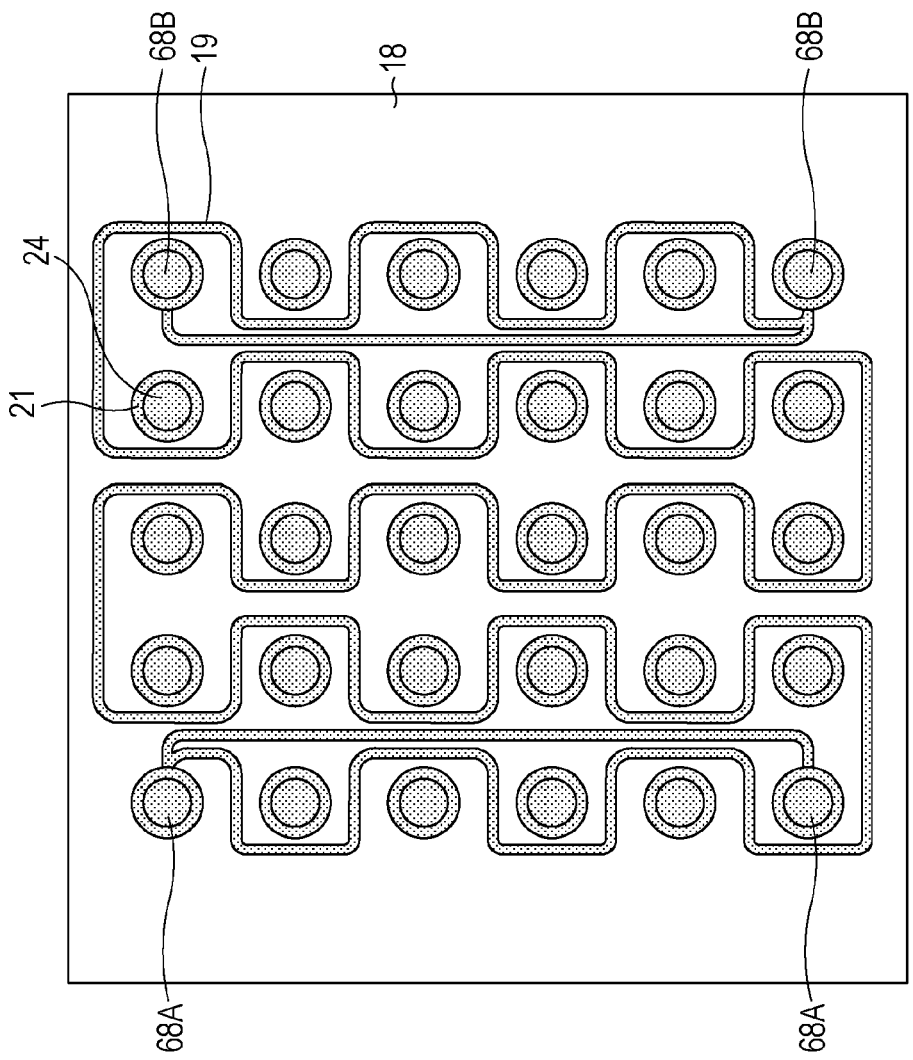

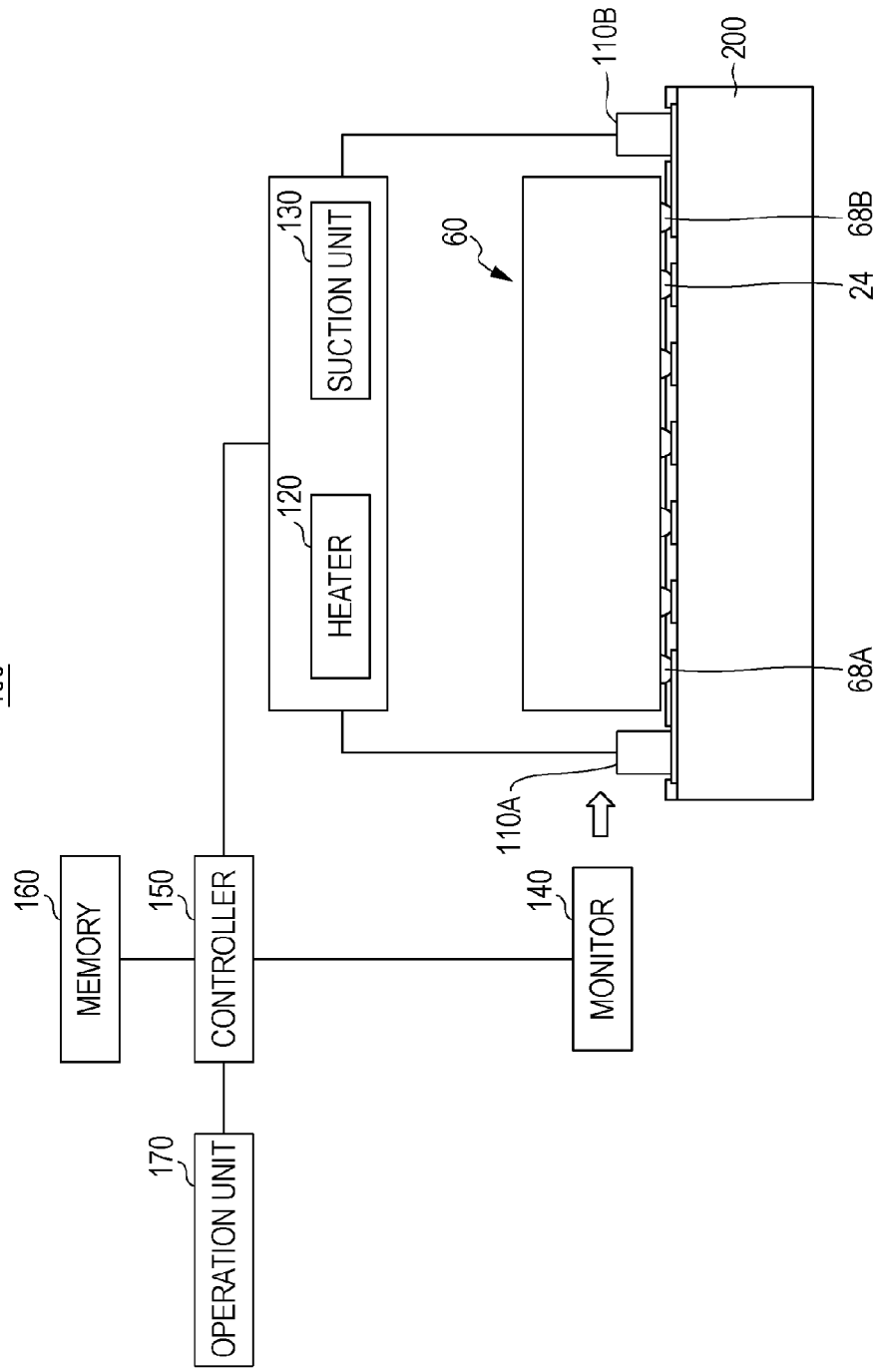

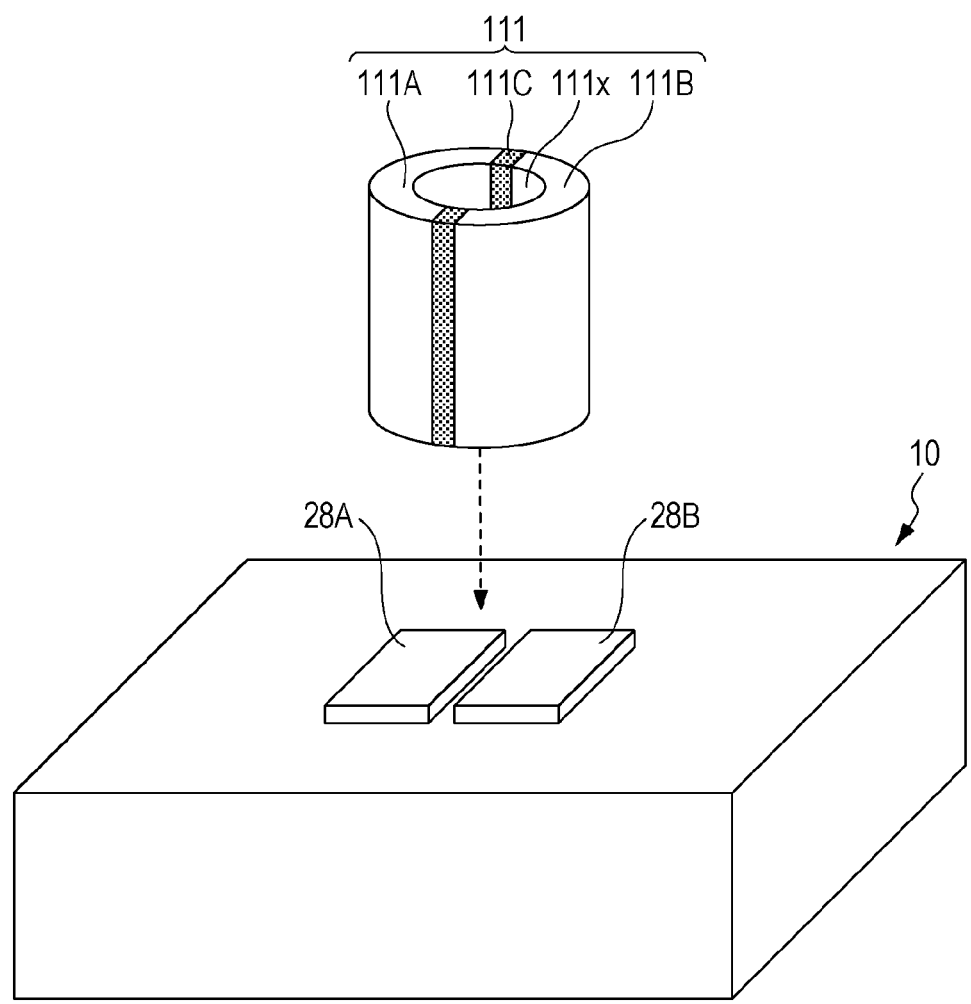

ELECTRONIC COMPONENT AND ELECTRONIC COMPONENT ASSEMBLY APPARATUS

CROSS-REFERENCE TO RELATED APPLICATION

This application is based upon and claims the benefit of priority of the prior Japanese Patent Application No. 2011-58364, filed on Mar. 16, 2011, the entire contents of which are incorporated herein by reference.

FIELD

The embodiments discussed herein are related to an electronic component to be mounted on a substrate and an electronic component assembly apparatus that mounts the electronic component on a substrate or removes the electronic component from the substrate on which the electronic component is mounted.

BACKGROUND

Various recent devices such as television sets and personal computers have a substrate on which electronic components such as semiconductor devices and capacitors are mounted using solder or the like. If any of the electronic components mounted on the substrate are defective, removing the defective electronic components from the substrate and mounting new replacement electronic components on the substrate, called repair work, are involved.

The repair work is desirably performed without damaging a component or components around a defective electronic component or without damaging the substrate on which the defective electronic component is mounted because the components other than the defective electronic component are continued to be used after the defective electronic component has been removed. Further, the repair work is desirably performed without damaging an electronic component body (such as a semiconductor chip) of the defective electronic component because failure analysis of the defective electronic component is performed after the defective electronic component has been removed.

In the related art, the repair work is performed by, for example, blowing hot air at a temperature equal to or higher than the melting point of solder by using an air heater onto an electronic component to be repaired to heat the electronic component and by melting solder. However, in this method, the electronic component is heated by blowing hot air onto the electronic component, which may hinder efficient heat transfer to solder. When the solder is melted, the temperature of the electronic component or the substrate becomes high, and the electronic component body or substrate, which is an important part for the electronic component to function, may be damaged. On a substrate with a high mounting density, it is difficult to blow hot air onto only the electronic component to be repaired, and hot air may also be blown onto a neighboring component or components, resulting in a possibility that the neighboring component or components will also be removed together with the electronic component to be repaired.

Many techniques for overcoming the above problems have been proposed. For example, a semiconductor device has been proposed in which a repair sheet having a heating wire is placed between a semiconductor package and a substrate so as to surround solder balls that connect the semiconductor package and the substrate. In this semiconductor device, only the semiconductor package can be removed by heating the repair sheet by using the heating wire to melt the solder balls surrounded by the repair sheet. In this semiconductor device, furthermore, only the semiconductor package can be mounted by mounting the semiconductor package on the substrate with the repair sheet being held therebetween so as to surround the solder balls and by heating the repair sheet by using the heating wire to melt the solder balls surrounded by the repair sheet (see, for example, Japanese Laid-open Patent Publication No. 11-87906).

Further, a ball-grid array (BGA) package substrate has been proposed on which a heat generating resistor layer such as a Ni—Cr layer is formed with an electric insulating layer disposed between the heat generating resistor layer and the BGA package substrate so as to surround lands on which solder balls are to be mounted. Only the BGA package can be removed from the substrate by causing a current to flow through the heat generating resistor layer to generate heat and by melting the solder balls that bond the BGA package to the substrate (see, for example, Japanese Laid-open Patent Publication No. 10-284820).

Further, a semiconductor device has been proposed in which a heat generating member of Ni—Cr or the like for heating projecting electrodes that connect a semiconductor chip and a substrate is provided in a certain portion on the semiconductor chip or the substrate. In this semiconductor device, only the semiconductor chip can be removed by heating the heat generating member to melt the projecting electrodes (see, for example, Japanese Laid-open Patent Publication No. 61-148830).

The techniques proposed in Japanese Laid-open Patent Publication No. 11-87906, Japanese Laid-open Patent Publication No. 10-284820, and Japanese Laid-open Patent Publication No. 61-148830, described above, may reduce damage to an electronic component body or a substrate, compared to a method of removing an electronic component by blowing hot air onto the electronic component by using an air heater. However, in the techniques proposed in Japanese Laid-open Patent Publication No. 11-87906, Japanese Laid-open Patent Publication No. 10-284820, and Japanese Laid-open Patent Publication No. 61-148830, transfer of heat to the electronic component body is not blocked, and there may still be a risk of damaging the electronic component body.

SUMMARY

According to an aspect of the invention, an electronic component includes a wiring substrate having a first surface and a second surface, an electronic component body mounted on a first surface side of the wiring substrate, an external electrode formed on a second surface side of the wiring substrate which is opposite to the first surface side, the external electrode being electrically connected to the electronic component body, a heat generating member having a conductive property and having a higher resistivity than the external electrode, and a heat insulating layer disposed between the electronic component body and the heat generating member, the heat insulating layer having an insulating property and being formed of a material different from an other material of the wiring substrate.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a cross-sectional view illustrating an example of a semiconductor device according to a first embodiment.

FIG. 2A is a bottom view illustrating an example of the semiconductor device according to the first embodiment.

FIG. 2B is a bottom view illustrating another example of the semiconductor device according to the first embodiment.

FIG. 2C is a bottom view illustrating still another example of the semiconductor device according to the first embodiment.

FIG. 3 is a schematic view illustrating an example of an apparatus that is used to mount and remove a semiconductor device.

FIG. 5A is a flowchart illustrating an example of a procedure for removing a semiconductor device.

FIG. 11 is a cross-sectional view illustrating an example of a semiconductor device according to a second embodiment.

FIG. 12A is a bottom view illustrating an example of the semiconductor device according to the second embodiment.

FIG. 12B is a bottom view illustrating another example of the semiconductor device according to the second embodiment.

FIG. 12C is a bottom view illustrating still another example of the semiconductor device according to the second embodiment.

FIG. 13 is a schematic view illustrating another example of the apparatus that is used to mount and remove a semiconductor device.

FIG. 20A is a perspective view illustrating another example of nozzles.

DESCRIPTION OF EMBODIMENTS

Figure 4:
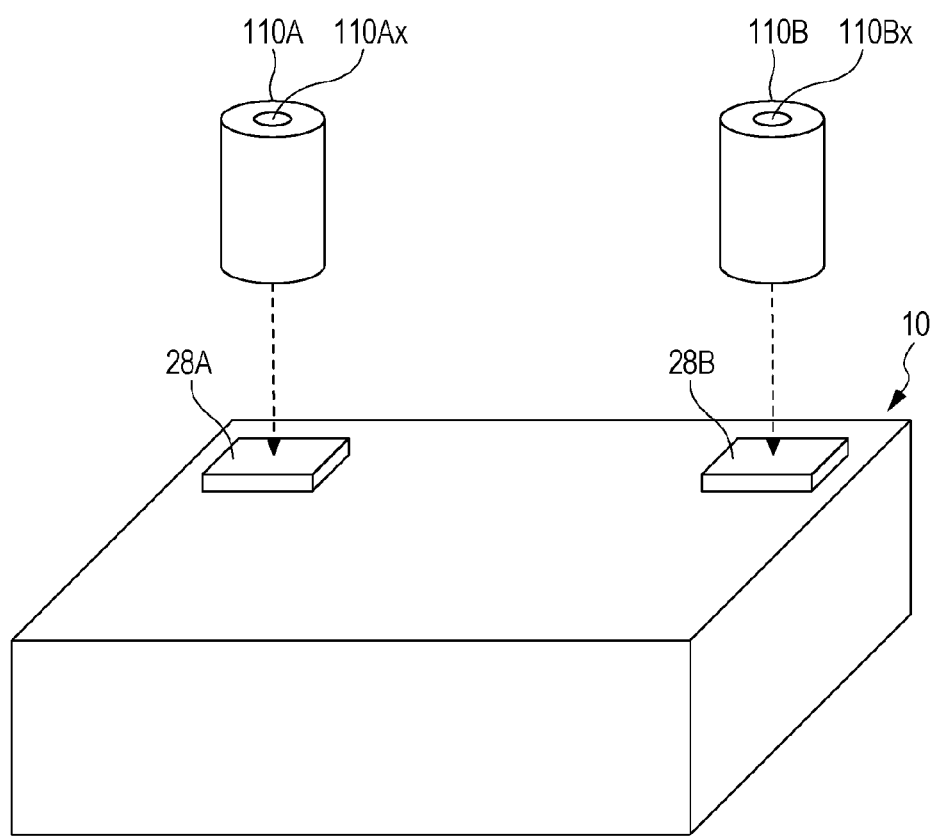
FIG. 4 is a perspective view illustrating an example of nozzles.

Embodiments will be described hereinafter with reference to the drawings. In the drawings, elements having substantially the same configuration are represented by the same numerals and a redundant description thereof may be omitted.

The term "electronic component", as used herein, is used to refer to a semiconductor device having an active element such as a semiconductor chip, and also refer to a passive element such as a capacitor or a resistor. An important part for an electronic component to function is referred to herein as an "electronic component body". For example, when the electronic component is a semiconductor device, the electronic component body may be a semiconductor chip. When the electronic component is a capacitor, the electronic component body may be a portion including a dielectric and serving as a capacitor. When the electronic component is a resistor, the electronic component body may be a portion including a resistive element and serving as a resistor.

First Embodiment

Structure of Semiconductor Device

First, the structure of a semiconductor device according to a first embodiment will be described. FIG. 1 is a cross-sectional view illustrating an example of the semiconductor device according to the first embodiment. FIG. 2A is a bottom view illustrating the example of the semiconductor device according to the first embodiment. FIG. 1 illustrates cross-section taken along line I-I in FIG. 2A. In FIG. 2A, a third insulating layer 23, described below, is not illustrated for convenience of illustration.

Referring to FIG. 1, a semiconductor device 10 includes a wiring substrate 11, a semiconductor chip 25, bumps 26, a sealing member 27, heating electrodes 28A and 28B, and through-wires 29A and 29B. The wiring substrate 11 may be any of various wiring substrates such as a so-called glass epoxy substrate in which a resin containing an epoxy resin or the like as a main component is impregnated into a glass fabric and a so-called build-up wiring substrate in which an insulating layer containing an epoxy resin or the like as a main component and a wiring layer are alternately stacked.

The wiring substrate 11 has a structure in which a first wiring layer 12, a first insulating layer 13, a second wiring layer 14, a second insulating layer 15, a third wiring layer 16, a heat insulating layer 17, a thermal diffusion layer 18, a heat generating member 19, a fourth wiring layer 20, and the third insulating layer 23 are sequentially stacked. The surface of the wiring substrate 11 on the first wiring layer 12 side may be referred to as a "first principal surface". The surface of the wiring substrate 11 on the third insulating layer 23 side may be referred to as a "second principal surface".

The first wiring layer 12 and the second wiring layer 14 are electrically connected to each other, as desired, by a first through-wire 13x disposed in a through-hole extending through the first insulating layer 13. The second wiring layer 14 and the third wiring layer 16 are electrically connected to each other, as desired, by a second through-wire 15x disposed in a through-hole extending through the second insulating layer 15. The third wiring layer 16 and the fourth wiring layer 20 are electrically connected to each other, as desired, by a third through-wire 17x disposed in a through-hole extending through the heat insulating layer 17 and the thermal diffusion layer 18.

The fourth wiring layer 20 has a plurality of external electrodes 21 exposed from opening portions 23x in the third insulating layer 23 (or exposed from the second principal surface of the wiring substrate 11), and two internal electrodes 22A and 22B electrically connected to both ends of the heat generating member 19. Each of the plurality of external electrodes 21 has an external connection terminal 24 formed thereon. However, the external electrodes 21 may not necessarily have the external connection terminals 24 formed thereon. For example, a semiconductor device 10 having no external connection terminals 24 may be shipped as a product. In this case, a person who has obtained the product may mount the external connection terminals 24 on the external electrodes 21. Alternatively, external connection terminals may be formed on a substrate on which the semiconductor device 10 is to be mounted, and the external connection terminals formed on the substrate and the external electrodes 21 of the semiconductor device 10 may be connected to each other. Therefore, the external electrodes 21 are electrodes that are electrically connected to the semiconductor chip 25 serving as an electronic component body and that are electrically connectable to the external connection terminals 24.

Examples of the material of the first wiring layer 12, the second wiring layer 14, the third wiring layer 16, the fourth wiring layer 20, the first through-wire 13x, the second through-wire 15x, and the third through-wire 17x may include conductive materials such as copper (Cu) and aluminum (Al). Examples of the material of the first through-wire 13x, the second through-wire 15x, and the third through-wire 17x may further include conductive polymers such as polyacetylene and polythiophene. The first wiring layer 12, the second wiring layer 14, the third wiring layer 16, the fourth wiring layer 20, the first through-wire 13x, the second through-wire 15x, and the third through-wire 17x may be formed by, for example, electroless plating.

A gold (Au) plating film may be formed on a surface of the first wiring layer 12 (bumps 26 side) or on a surface of the external electrodes 21 (external connection terminals 24 side). Instead of a gold (Au) plating film, for example, a nickel (Ni)/gold (Au) plating film (which is a plating film formed by stacking Ni and Au on each other in this order) or a nickel (Ni)/palladium (Pd)/gold (Au) plating film (which is a plating film formed by stacking Ni, Pd, and Au on one another in this order) may be formed.

Examples of the material of the first insulating layer 13, the second insulating layer 15, and the third insulating layer 23 may include an insulating resin containing an epoxy resin as a main component. The first insulating layer 13, the second insulating layer 15, and the third insulating layer 23A may be provided with a reinforcing member of glass fabric or the like. Examples of the material of the external connection terminals 24 may include a Sn—Ag—Cu soldering material (with a melting point of approximately 215° C. to 235° C.) such as Sn-3.0 Ag-0.5Cu solder.

The heat generating member 19 has a function of generating heat once current is flowing through the heat generating member 19. The heat generating member 19 is formed over an entire surface of the thermal diffusion layer 18 in such a manner that, for example, as illustrated in FIG. 2A, the heat generating member 19 is turned around so as not to be in contact with the external electrodes 21 and the external connection terminals 24. The heat generating member 19 is disposed so as to be in contact with the thermal diffusion layer 18, thus allowing heat generated by the heat generating member 19 to be efficiently transferred to the thermal diffusion layer 18. Both ends of the heat generating member 19 are electrically connected to the internal electrodes 22A and 22B. When a certain voltage is applied between the internal electrodes 22A and 22B, current flows through the heat generating member 19 to generate heat, and the generated heat may melt the external connection terminals 24 connected to the external electrodes 21.

The term "heat generating member", as used herein, is used to refer to a member capable of generating heat sufficient to melt a conductive material (such as a solder or conductive paste) that connects an electronic component to a substrate by causing a current to flow through the member. Alternatively, the term "heat generating member", as used herein, is used to refer to a member capable of holding heat sufficient to melt a conductive material (such as a solder or conductive paste) that connects an electronic component to a substrate by supplying heat to the element from outside the electronic component, as described below.

Examples of the material of the heat generating member 19 may include metal materials such as nichrome (Ni—Cr), tungsten (W), indium tin oxide (ITO), tin oxide (TO), and fluorine doped tin oxide (FTO), and non-metal materials such as carbon nanotubes, polypyrrole, polyaniline, and polyphenylene. The heat generating member 19 may be formed on the thermal diffusion layer 18 as a thin film by, for example, sputtering or vacuum deposition. The heat generating member 19 may also be formed on the thermal diffusion layer 18 as a thick film by, for example, firing. The thickness of the heat generating member 19 may be determined as desired, and may be, for example, approximately 5 to 20 μm. The width of the heat generating member 19 may be determined as desired, and may be, for example, approximately 5 to 20 μm.

The thermal diffusion layer 18 has a function of uniformly diffusing heat generated by the heat generating member 19. The thermal diffusion layer 18 uniformly diffuses heat generated by the heat generating member 19 and exhibits a substantially constant temperature. The thermal diffusion layer 18 allows heat generated by the heat generating member 19 to be efficiently transmitted to the plurality of external connection terminals 24. Examples of the material of the thermal diffusion layer 18 may include high thermal conductivity ceramics such as aluminum nitride (AlN) and silicon carbide (SiC). The thickness of the thermal diffusion layer 18 may be determined as desired, and may be, for example, approximately 10 to 100 μm.

The thermal diffusion layer 18 may be fabricated by the following method: For example, a green sheet is fabricated using a slurry in which a ceramic powder is mixed with an organic binder, and through-holes are formed in the fabricated green sheet so as to extend through layers. A conductive paste or the like is filled into the through-holes to fabricate a through-wire, and then the green sheet is fired. The thermal diffusion layer 18 may be formed on the heat insulating layer 17 by, for example, stacking the thermal diffusion layer 18 on the heat insulating layer 17 using a thermosetting adhesive containing an epoxy resin as a main component and pressing the thermal diffusion layer 18 toward the heat insulating layer 17 while heating the thermosetting adhesive with the thermal diffusion layer 18 stacked on the heat insulating layer 17.

The heat insulating layer 17 has a function of keeping heat generated by the heat generating member 19 and diffused uniformly by the thermal diffusion layer 18 from being transferred to the semiconductor chip 25. The heat insulating layer 17 between the thermal diffusion layer 18 and the semiconductor chip 25 may keep heat generated by the heat generating member 19 and diffused uniformly by the thermal diffusion layer 18 from being transferred to the semiconductor chip 25, and may avoid any damage to the semiconductor chip 25 caused by heat. The heat insulating layer 17 also allows heat generated by the heat generating member 19 and diffused uniformly by the thermal diffusion layer 18 to be efficiently transmitted to the external connection terminals 24 without dissipation. Examples of the material of the heat insulating layer 17 may include low thermal conductivity ceramics such as aluminum titanate ($AlTiO_3$) and zirconia ($ZrO_2$), and polyimide resin. Preferably, the heat insulating layer 17 has a lower thermal conductivity than the electrical insulating layers (i.e., the first insulating layer 13, the second insulating layer 15, and the third insulating layer 23) of the wiring substrate 11. The thickness of the heat insulating layer 17 may be determined as desired, and may be, for example, approximately 10 to 100 μm.

When the heat insulating layer 17 is a ceramic layer, the heat insulating layer 17 may be fabricated using a method similar to that of the thermal diffusion layer 18. The heat insulating layer 17 may be formed on the second insulating layer 15 by the following method: For example, a thermosetting resin containing an epoxy resin as a main component is selected as the material of the second insulating layer 15, and the heat insulating layer 17 is stacked on the second insulating layer 15. The heat insulating layer 17 is pressed toward the second insulating layer 15 while the second insulating layer 15 is heated with the heat insulating layer 17 stacked on the second insulating layer 15. When the heat insulating layer 17 is a polyimide resin layer, the heat insulating layer 17 may be formed on the second insulating layer 15 by laminating a polyimide resin on the second insulating layer 15.

Desirably, the heat insulating layer 17 has a lower thermal conductivity than the thermal diffusion layer 18. The thermal conductivity of the heat insulating layer 17 is preferably ½₀ or less the thermal conductivity of the thermal diffusion layer 18.

In general, an electrical insulating layer containing an epoxy resin as a main component is disposed on a wiring substrate, and such an electrical insulating layer has a relatively low thermal conductivity. However, using such an electrical insulating layer also as a heat insulating layer may cause the wiring substrate to be warped depending on the allowable temperature limit, thermal expansion coefficient, and the like of the electrical insulating layer, resulting in a possible risk of low connection reliability with a semiconductor chip. Therefore, it is desirable that a heat insulating layer be provided separately from the electrical insulating layer.

The heat insulating layer 17 may not necessarily be located adjacent to the thermal diffusion layer 18, and may be located at any desired position between the thermal diffusion layer 18 and the electronic component body that is to be protected from being damaged (in this case, the semiconductor chip 25) to avoid damaging of the semiconductor chip 25. However, in order to achieve efficient transmission of heat generated by the heat generating member 19 and diffused uniformly by the thermal diffusion layer 18 to the external connection terminals 24 without dissipation, the heat insulating layer 17 is preferably located adjacent to the thermal diffusion layer 18. Also in order to avoid any warping caused by the heat of an electrical insulating layer containing an epoxy resin or the like as a main component, the heat insulating layer 17 is preferably located adjacent to the thermal diffusion layer 18 without an electrical insulating layer disposed between the heat insulating layer 17 and the thermal diffusion layer 18.

The semiconductor chip 25 (or electronic component body) is flip-chip connected to the wiring substrate 11 via the bumps 26. The semiconductor chip 25 may be fabricated by, for example, forming a semiconductor integrated circuit, a protective film, electrodes, etc., on a semiconductor substrate such as a silicon (Si) substrate, a silicon on insulator (SOI) substrate, or a gallium arsenide (GaAs) substrate.

The bumps 26 serve to electrically connect electrodes (not illustrated) of the semiconductor chip 25 to the first wiring layer 12 of the wiring substrate 11. Examples of the material of the bumps 26 may include solder materials having a higher melting point than the external connection terminals 24, such as Sn-95 Pb (with a melting point of approximately 270° C. to 330° C.), Sn-80Au (with a melting point of approximately 280° C. to 320° C.), and Sn-0.7Cu (with a melting point of approximately 240° C. to 270° C.).

The bumps 26 are formed of a solder material having a higher melting point than the external connection terminals 24, and a temperature at which the bumps 26 are not melted but the external connection terminals 24 are melted is set when the semiconductor device 10 is to be removed from the substrate on which the semiconductor device 10 is mounted, thus allowing the semiconductor device 10 to be removed substantially without any influence on the bumps 26. In addition, a temperature at which the bumps 26 are not melted but the external connection terminals 24 are melted is set when the semiconductor device 10 is to be mounted on a substrate, thus allowing the semiconductor device 10 to be mounted substantially without any influence on the bumps 26. In the semiconductor device 10 according to this embodiment, the heat insulating layer 17 blocks heat from being transferred from the external connection terminals 24 to the bumps 26. Therefore, the bumps 26 may be formed of the same material as that of the external connection terminals 24.

A sealing member 27 is provided on the first principal surface of the wiring substrate 11 so as to seal the semiconductor chip 25. Examples of the material of the sealing member 27 may include an insulating resin containing an epoxy resin as a main component. The examples of the material of the sealing member 27 may also include fillers such as silica ($SiO_2$) and alumina ($Al_2O_3$).

The heating electrodes 28A and 28B are provided on the sealing member 27. Further, the heating electrodes 28A and 28B are electrically connected to both ends of the heat generating member 19 via the through-wires 29A and 29B formed in the through-holes extending through the sealing member 27, the first insulating layer 13, the second insulating layer 15, the heat insulating layer 17, and the thermal diffusion layer 18, and also via the internal electrodes 22A and 22B. As described below, the heating electrodes 28A and 28B are portions against which nozzles are abutted when the semiconductor device 10 is to be mounted or removed.

Examples of the material of the heating electrodes 28A and 28B and the through-wires 29A and 29B may include conductive materials such as copper (Cu) and aluminum (Al). Examples of the material of the through-wires 29A and 29B may also include conductive polymers such as polyacetylene and polythiophene. The heating electrodes 28A and 28B and the through-wires 29A and 29B may be formed by, for example, electroless plating. A gold (Au) plating film may be formed on a surface of the heating electrodes 28A and 28B and on a surface of the through-wires 29A and 29B (through-hole inner wall surface side). Instead of a gold (Au) plating film, for example, a nickel (Ni)/gold (Au) plating film (which is a plating film formed by stacking Ni and Au on each other in this order) or a nickel (Ni)/palladium (Pd)/gold (Au) plating film (which is a plating film formed by stacking Ni, Pd, and Au on one another in this order) may be formed.

In the semiconductor device 10, heat generated by causing a current to flow through the heat generating member 19 is diffused uniformly by the thermal diffusion layer 18, and heats the external connection terminals 24. As a result, the external connection terminals 24 are melted, and the semiconductor device 10 may be removed from the substrate on which the semiconductor device 10 is mounted. The semiconductor device 10 may also be mounted on a substrate.

Since only the semiconductor device 10 is heated, only the semiconductor device 10 may be removed without removing or damaging other components around the semiconductor device 10.

Since the semiconductor device 10 includes the heat insulating layer 17, which may keep heat generated by the heat generating member 19 and diffused uniformly by the thermal diffusion layer 18 from being transferred to the semiconductor chip 25 side, the semiconductor chip 25 (or electronic component body) may be protected from being damaged by heat. Since the semiconductor device 10 includes the heat insulating layer 17, furthermore, heat generated by the heat generating member 19 and diffused uniformly by the thermal diffusion layer 18 may be efficiently transmitted to the external connection terminals 24 without dissipation.

The heat generating member 19 may not necessarily have the pattern illustrated in FIG. 2A, and may have any pattern as long as the heat generating member 19 is turned around on an entire surface of the thermal diffusion layer 18. For example, the heat generating member 19 may have a pattern illustrated in FIG. 2B in which the heat generating member 19 meanders around the external connection terminals 24 or a pattern illustrated in FIG. 2C in which the heat generating member 19 is formed substantially around the external connection terminals 24. The heat generating member 19 may have any other suitable pattern. The internal electrodes 22A and 22B may be disposed on one side of the thermal diffusion layer 18, as illustrated in FIG. 2A, or may be disposed diagonally, as illustrated in FIG. 2B or 2C. The internal electrodes 22A and 22B may be disposed at other suitable positions. The heating electrodes 28A and 28B may also be disposed on one side of the thermal diffusion layer 18, or diagonally. The heating electrodes 28A and 28B may be disposed at other suitable positions. As described below, the heating electrodes 28A and 28B may also be disposed close to each other, thus enabling different voltages to be applied to the heating electrodes 28A and 28B using a single nozzle.

Mounting and Removal of Semiconductor Device

Next, the mounting and removal of a semiconductor device according to the first embodiment will be described. FIG. 3 is a schematic view illustrating an example of an apparatus that is used to mount and remove a semiconductor device. Referring to FIG. 3, an apparatus 100 includes nozzles 110A and 110B, a heater 120, a suction unit 130, a monitor 140, a controller 150, a memory 160, and an operation unit 170. The semiconductor device 10 is mounted on a substrate 200. That is, the external connection terminals 24 are melted, thereby electrically connecting the external electrodes 21 of the semiconductor device 10 to corresponding electrodes on the substrate 200. The nozzles 110A and 110B are typical examples of an abutting unit according to the present disclosure. The nozzles 110A and 110B (or abutting unit), the heater 120, and the suction unit 130 are typical examples of elements included in an electronic component assembly apparatus according to the present disclosure.

In the apparatus 100, one of the nozzles 110A and 110B is a positive electrode, and the other is a negative electrode. The nozzles 110A and 110B are abutted against and are electrically connected to the heating electrodes 28A and 28B of the semiconductor device 10, respectively. Since the heating electrodes 28A and 28B have no polarity, each of the nozzles 110A and 110B may be abutted against either the heating electrode 28A or 28B.

FIG. 4 is a perspective view illustrating an example of nozzles. As illustrated in FIG. 4, the nozzles 110A and 110B may be, for example, substantially circularly cylindrical members having through-holes 110Ax and 110Bx in center portions thereof, respectively, so as to extend from the top to the bottom thereof, the through-holes 110Ax and 110Bx being circular when viewed in plan. The nozzles 110A and 110B are formed of a conductive material such as copper (Cu) or aluminum (Al). However, the nozzles 110A and 110B are not limited to circularly cylindrical members having through-holes in center portions thereof, and may be members of other shapes having through-holes in center portions thereof, such as an elliptical cylindrical shape, a rectangular cylindrical shape, or a polygonal shape.

The through-holes 110Ax and 110Bx are disposed to allow air or the like (for example, air containing ions having an electrostatic removal or cleaning effect) to pass therethrough, and an end of each of the through-holes 110Ax and 110Bx is connected to the suction unit 130. The semiconductor device 10 may be removed from the substrate 200 by heating and melting the external connection terminals 24 and then applying suction to the semiconductor device 10 with air or the like through the through-holes 110Ax and 110Bx. In addition, the semiconductor device 10 may be mounted on the substrate 200 by applying suction to the semiconductor device 10 with air or the like through the through-holes 110Ax and 110Bx, placing the semiconductor device 10 on the substrate 200, heating and melting the external connection terminals 24, and then stopping the suction of air or the like. In order to facilitate separation of the semiconductor device 10 from the nozzles 110A and 110B, air or the like may be blown out toward the semiconductor device 10 after the suction of air or the like is stopped.

Referring back to FIG. 3, the heater 120 has a function of generating heat by generating a potential difference between the nozzles 110A and 110B (or by applying a voltage between the heating electrodes 28A and 28B) and supplying a current to the heat generating member 19. The heater 120 may be, for example, a direct current power supply capable of variably controlling the output voltage.

The suction unit 130 has functions of applying suction to the heating electrodes 28A and 28B of the semiconductor device 10 through the through-holes 110Ax and 110Bx formed in the nozzles 110A and 110B, stopping suction, and blowing out air or the like toward the heating electrodes 28A and 28B. The suction unit 130 includes, for example, a suction pump that supplies negative pressure during suction, suction tubes that connect the suction pump to the nozzles 110A and 110B, and any other suitable element.

The monitor 140 has a function of monitoring the temperatures, solder shapes, or the like of certain portions on the semiconductor device 10 and the substrate 200, the overall states of the semiconductor device 10 and the substrate 200, or the like. Monitoring results obtained by the monitor 140 are transmitted to the controller 150. The monitor 140 may be, for example, an image recognition device including a camera, a thermography, and any other suitable device.

The controller 150 has a function of commanding the heater 120 to control a potential difference between the nozzles 110A and 110B. The controller 150 further has functions of detecting a current flowing between the nozzles 110A and 110B (or current flowing through the heat generating member 19) and performing feedback control so that the current has a substantially constant value. The controller 150 further has a function of instructing the suction unit 130 to apply suction to the semiconductor device 10 using the nozzles 110A and 110B, stop suction, or blow out air or the like toward the semiconductor device 10. The controller 150 further has a function of determining, based on information transmitted from the monitor 140, whether or not the temperature of the external connection terminals 24 has reached the melting point, whether or not the shape of the external connection terminals 24 is appropriate, or the like.

The controller 150 includes, for example, a central processing unit (CPU), a read-only memory (ROM), a main memory, and any other suitable device, and the functions of the controller 150 may be implemented by reading a program recorded on the ROM or the like into the main memory and executing the program by the CPU. However, part or the entirety of the controller 150 may be implemented by hardware. The controller 150 may physically include a plurality of devices.

The memory 160 has a function of storing information (such as the resistance value of the heat generating member 19) about an electronic component to be mounted or removed (in this case, the semiconductor device 10). The memory 160 also has a function of making a database of variations of heat capacity of electronic components to be mounted or removed, optimum applied voltages and applied currents that support the variations of the heat capacity, and other suitable information, and storing the database. The controller 150 may set, based on the information stored in the form of database in the memory 160, an optimum applied current in accordance with the variations of heat capacity or the like of electronic components. For example, the controller 150 may initially increase the amount of current to be applied if an electronic component has a high heat capacity, and may decrease the amount of current to be applied if an electronic component has a low heat capacity. Therefore, heating time may not be increased when the heat capacity is high, and temperature may not be excessively increased when the heat capacity is low. The memory 160 may be a semiconductor memory, an optical disk, a magnetic disk, or the like. The operation unit 170 has a function of entering, for example, an instruction for starting mounting of an electronic component.

Next, a procedure for removing the semiconductor device 10 using the apparatus 100 will be described. It is assumed here that, as illustrated in FIG. 3, the semiconductor device 10 is mounted on the substrate 200. FIG. 5A is a flowchart illustrating an example of a procedure for removing a semiconductor device.

Referring to FIG. 5A, in step S10, as illustrated in FIGS. 3 and 4, the nozzles 110A and 110B, one of which is a positive electrode and the other of which is a negative electrode, is abutted against the heating electrodes 28A and 28B of the semiconductor device 10, respectively. Thus, the nozzles 110A and 110B are electrically connected to the heating electrodes 28A and 28B of the semiconductor device 10, respectively. In this stage, the suction unit 130 is not doing suction. The controller 150 commands the heater 120 to set the potential difference between the nozzles 110A and 110B to a certain value, and to start applying a voltage between the nozzles 110A and 110B. Therefore, a current flows through the heat generating member 19 and heat is generated. The heat generated by the heat generating member 19 is diffused uniformly by the thermal diffusion layer 18 and is transferred to the external connection terminals 24, and the external connection terminals 24 are heated. The resistance value of the heat generating member 19 is known in advance, and the resistance value of the heat generating member 19, the value of the voltage to be initially applied to the heat generating member 19 (or the potential difference to be set between the nozzles 110A and 110B), and the value of the current flowing at that time are stored in the memory 160.

In step S11, the monitor 140 monitors the temperature of the external connection terminals 24, and transmits the monitoring results to the controller 150. The temperature may be monitored by using, for example, a thermography.

In step S12, the controller 150 determines, based on the information transmitted from the monitor 140 in step S11, whether or not the temperature of the external connection terminals 24 has exceeded the melting point of the solder that is a material of the external connection terminals 24. The material of the external connection terminals 24 is known in advance, and information about the melting point of solder is stored in the memory 160.

If it is determined in step S12 that the temperature of the external connection terminals 24 has exceeded the melting point (Yes in step S12), the procedure proceeds to step S13. In step S13, the controller 150 detects the current flowing between the nozzles 110A and 110B (or the current flowing through the heat generating member 19), and commands the heater 120 to control the potential difference between the nozzles 110A and 110B so that the current has a substantially constant value. Therefore, the external connection terminals 24 have a substantially constant temperature.

If it is determined in step S12 that the temperature of the external connection terminals 24 has not exceeded the melting point (No in step S12), the procedure proceeds to step S14. In step S14, the controller 150 detects the current flowing between the nozzles 110A and 110B (or the current flowing through the heat generating member 19). The controller 150 commands the heater 120 to control the potential difference between the nozzles 110A and 110B so that the current has a larger value than the present value. Therefore, the current flowing between the nozzles 110A and 110B (or the current flowing through the heat generating member 19) increases, and the temperature of the external connection terminals 24 increases.

In step S15, the monitor 140 monitors the temperature and the solder shape of the external connection terminals 24, and transmits image information about the monitoring results to the controller 150. The image information about the temperature and the solder shape may be acquired by using, for example, a camera, a thermography, or the like.

In step S16, the controller 150 determines, based on the image information transmitted from the monitor 140 in step S15, whether or not the solder of the external connection terminals 24 has been melted. The determination may be made by, for example, comparing the image information transmitted from the monitor 140 with image information stored in advance in the memory 160.

If it is determined in step S16 that the solder of the external connection terminals 24 has been melted (Yes in step S16), the procedure proceeds to step S17. In step S17, the controller 150 commands the heater 120 to set the potential difference between the nozzles 110A and 110B to zero. Therefore, no current flows between the nozzles 110A and 110B (or through the heat generating member 19). If it is determined in step S16 that the solder of the external connection terminals 24 has not been melted (No in step S16), the procedure proceeds to step S11, and the process described above is repeatedly performed.

Then, in step S18, the controller 150 commands the suction unit 130 to apply suction to the heating electrodes 28A and 28B of the semiconductor device 10 with air or the like through the through-holes 110Ax and 110Bx in the nozzles 110A and 110B, respectively. Then, the semiconductor device 10 is moved from above the substrate 200, and the suction is stopped. Thus, the semiconductor device 10 is removed from the substrate 200. In order to facilitate separation of the semiconductor device 10 from the nozzles 110A and 110B, air or the like may be blown out toward the semiconductor device 10 after the suction of air or the like is stopped.

In step S19, the monitor 140 monitors the solder shape of the external connection terminals 24, and transmits image information about the monitoring result to the controller 150. The image information about the solder shape may be acquired by using, for example, a camera.

In step S20, the controller 150 determines, based on the image information transmitted from the monitor 140 in step S19, whether or not the semiconductor device 10 has been removed. The determination may be made by, for example, comparing the image information transmitted from the monitor 140 with image information stored in advance in the memory 160.

If it is determined in step S20 that the semiconductor device 10 has been removed (Yes in step S20), the removal of the semiconductor device 10 ends. If it is determined in step S20 that the semiconductor device 10 has not yet been removed (No in step S20), the procedure proceeds to step S16, and the process described above is repeatedly performed. In this way, the semiconductor device 10 may be removed from the substrate 200.

Figure 5B:
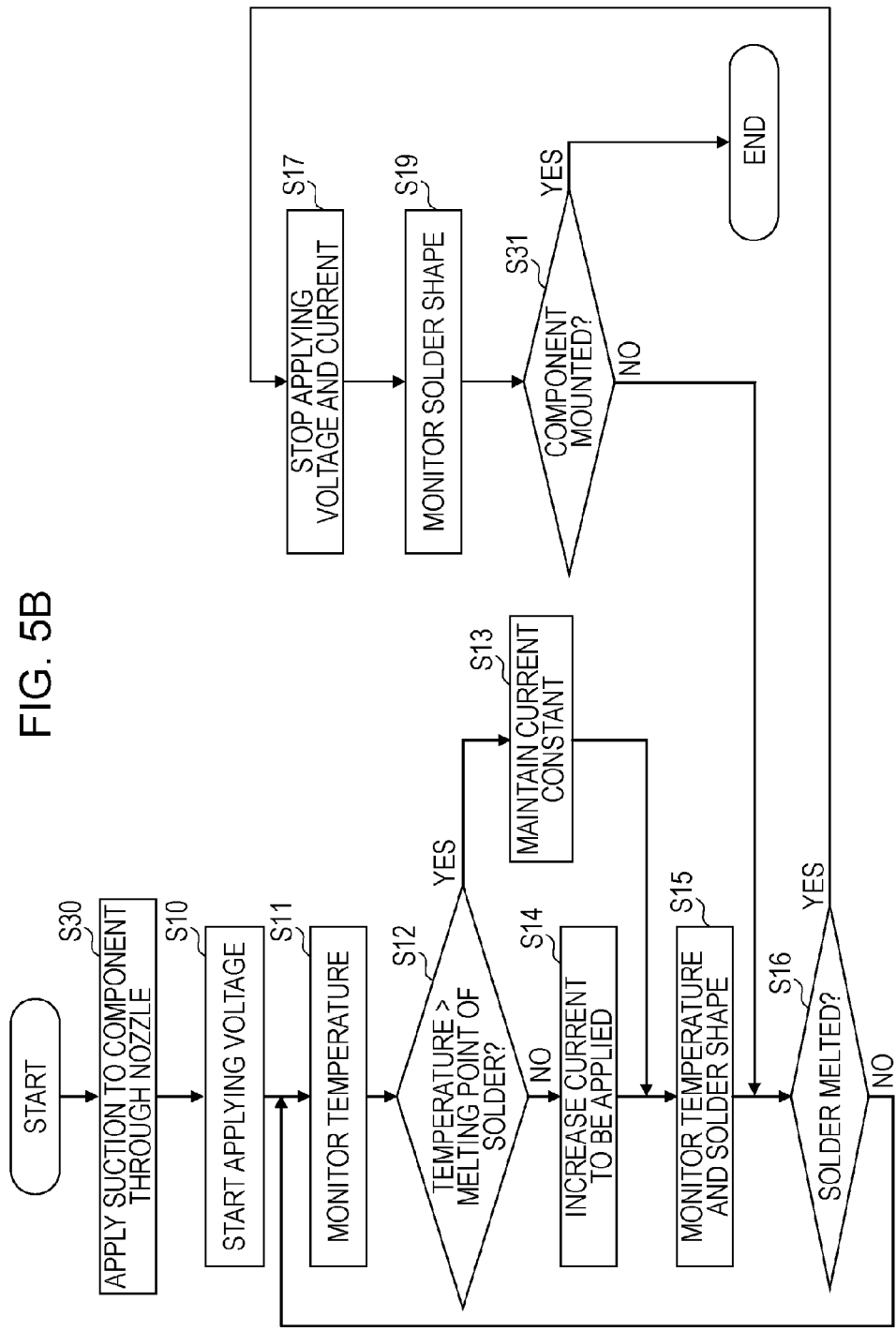
FIG. 5B is a flowchart illustrating an example of a procedure for mounting a semiconductor device.

Next, a procedure for mounting the semiconductor device 10 using the apparatus 100 will be described. It is assumed here that, as illustrated in FIG. 3, the semiconductor device 10 is to be mounted on the substrate 200. FIG. 5B is a flowchart illustrating an example of a procedure for mounting a semiconductor device.

Referring to FIG. 5B, in step S30, the nozzles 110A and 110B, one of which is a positive electrode and the other of which is a negative electrode, is abutted against the heating electrodes 28A and 28B of the semiconductor device 10, respectively. Thus, the nozzles 110A and 110B are electrically connected to the heating electrodes 28A and 28B of the semiconductor device 10, respectively. The controller 150 commands the suction unit 130 to apply suction to the heating electrodes 28A and 28B of the semiconductor device 10 with air or the like through the through-holes 110Ax and 110Bx in the nozzles 110A and 110B, respectively, and to place the semiconductor device 10 at a predetermined position on the substrate 200. After that, the suction is stopped.

Then, processing similar to that in steps S10 to S17 and S19 in FIG. 5A is performed. In step S31, the controller 150 determines, based on the image information transmitted from the monitor 140 in step S19, whether or not the semiconductor device 10 has been mounted. The determination may be made by, for example, comparing the image information transmitted from the monitor 140 with image information stored in advance in the memory 160.

If it is determined in step S31 that the semiconductor device 10 has been mounted (Yes in step S31), the mounting of the semiconductor device 10 ends by releasing the abutment between the nozzle 110A and the heating electrode 28A of the semiconductor device 10 and between the nozzle 110B and the heating electrode 28B of the semiconductor device 10. If it is determined in step S31 that the semiconductor device 10 has not yet been mounted (No in step S31), the procedure proceeds to step S16, and the process described above is repeatedly performed. In this way, the semiconductor device 10 may be mounted on the substrate 200.

In the first embodiment, therefore, only the semiconductor device 10 is heated when the semiconductor device 10 is to be mounted on a substrate or is to be removed 10 from the substrate on which the semiconductor device 10 is mounted. Thus, only the semiconductor device 10 may be mounted or removed without removing or damaging other components around the semiconductor device 10.

Since the semiconductor device 10 includes the heat insulating layer 17, which may keep heat generated by the heat generating member 19 and diffused uniformly by the thermal diffusion layer 18 from being transferred to the semiconductor chip 25 side, the semiconductor chip 25 (or electronic component body) may be protected from being damaged by heat. As a result, failure analysis of the semiconductor device 10 that has been removed may be made.

Since the semiconductor device 10 includes the heat insulating layer 17, heat generated by the heat generating member 19 and diffused uniformly by the thermal diffusion layer 18 may be efficiently transmitted to the external connection terminals 24 without dissipation.

First Modification of First Embodiment

In a first modification of the first embodiment, by way of example, a semiconductor device having a structure different from that in the first embodiment is provided. In the first modification of the first embodiment, portions having substantially the same configuration as those in the foregoing embodiment will not be described.

Figure 6:
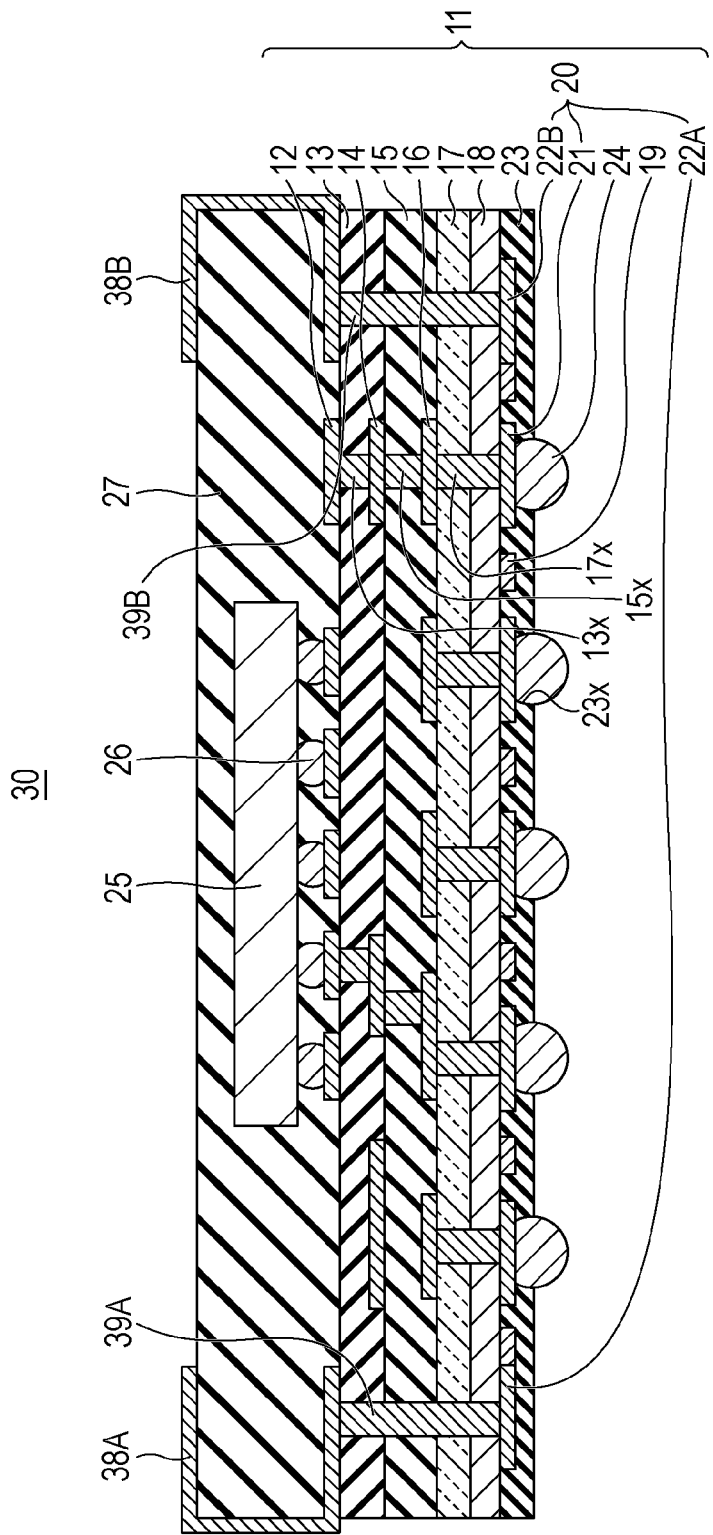
FIG. 6 is a cross-sectional view illustrating an example of a semiconductor device according to a first modification of the first embodiment.

FIG. 6 is a cross-sectional view illustrating an example of a semiconductor device according to the first modification of the first embodiment. Referring to FIG. 6, a semiconductor device 30 is different from the semiconductor device 10 (see FIG. 1) in that the heating electrodes 28A and 28B are replaced by heating electrodes 38A and 38B, respectively, and that the through-wires 29A and 29B are replaced by through-wires 39A and 39B, respectively.

In the semiconductor device 30, portions of the heating electrodes 38A and 38B are formed on the first principal surface of the wiring substrate 11, and extend across side surfaces and an upper surface of the sealing member 27 from the first principal surface. The heating electrodes 38A and 38B are electrically connected to both ends of the heat generating member 19 via the through-wires 39A and 39B and via the internal electrodes 22A and 22B. The through-wires 39A and 39B are formed in through-holes extending through the first insulating layer 13, the second insulating layer 15, the heat insulating layer 17, and the thermal diffusion layer 18. The heating electrodes 38A and 38B may be formed by, for example, electroless plating. Similarly to the heating electrodes 28A and 28B, the heating electrodes 38A and 38B are portions against which nozzles are abutted when the semiconductor device 30 is to be mounted or removed.

The heating electrodes 38A and 38B and the through-wires 39A and 39B may be formed of a material similar to the material of the heating electrodes 28A and 28B and the through-wires 29A and 29B. A plating film similar to that on the heating electrodes 28A and 28B and the through-wires 29A and 29B may be formed on a surface of the heating electrodes 38A and 38B and on a surface of the through-wires 39A and 39B.

Similarly to the semiconductor device 10, the semiconductor device 30 includes the heat insulating layer 17, the thermal diffusion layer 18, the heat generating member 19, and the heating electrodes 38A and 38B instead of the heating electrodes 28A and 28B. Thus, when the semiconductor device 30 is mounted on the substrate 200 (see FIG. 3), the semiconductor device 30 may be removed from the substrate 200 using the apparatus 100 illustrated in FIG. 3 in accordance with the flowchart illustrated in FIG. 5A. When the semiconductor device 30 is to be mounted on the substrate 200 (see FIG. 3), the semiconductor device 30 may be mounted on the substrate 200 using the apparatus 100 illustrated in FIG. 3 in accordance with the flowchart illustrated in FIG. 5B. As a result, advantages similar to those of the first embodiment may be achieved.

Figure 7:
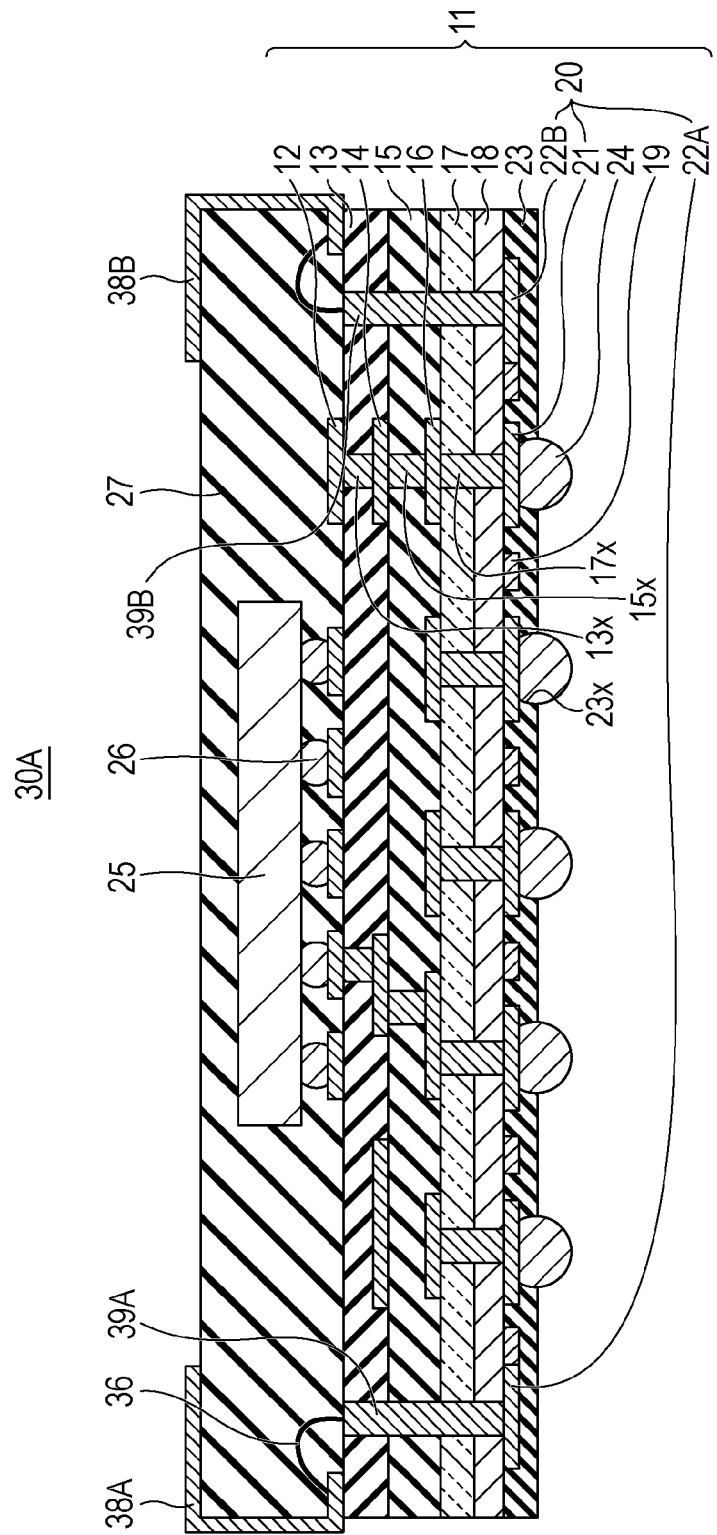
FIG. 7 is a cross-sectional view illustrating another example of the semiconductor device according to the first modification of the first embodiment.

Unlike the semiconductor device 30 illustrated in FIG. 6, as in a semiconductor device 30A illustrated in FIG. 7, the heating electrodes 38A and 38B may be electrically connected to first ends of the through-wires 39A and 39B through a bonding wire 36 without directly connecting the heating electrodes 38A and 38B to the first ends of the through-wires 39A and 39B. The bonding wire 36 may be a conductive wire such as a gold (Au) or copper (Cu) wire.

Second Modification of First Embodiment

In a second modification of the first embodiment, by way of example, a semiconductor device having a structure different from that in the first embodiment and that in the first modification is provided. In the second modification of the first embodiment, portions having substantially the same configuration as those in the foregoing embodiment and the modification thereof will not be described.

Figure 8:
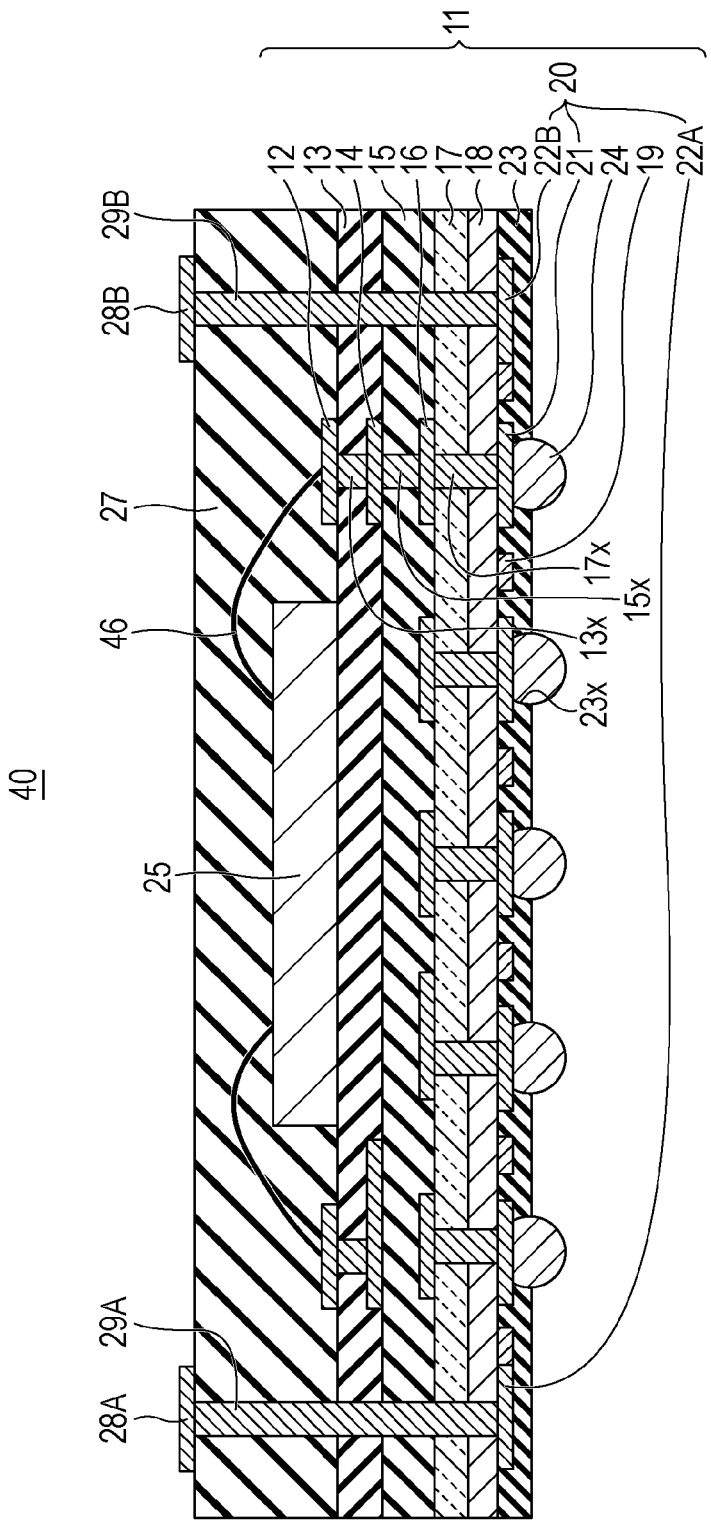
FIG. 8 is a cross-sectional view illustrating an example of a semiconductor device according to a second modification of the first embodiment.

FIG. 8 is a cross-sectional view illustrating an example of a semiconductor device according to the second modification of the first embodiment. Referring to FIG. 8, a semiconductor device 40 is different from the semiconductor device 10 (see FIG. 1) and the like in which the semiconductor chip 25 is flip-chip connected to the wiring substrate 11 through the bumps 26. In the semiconductor device 40, the semiconductor chip 25 is wire-bonded to the wiring substrate 11.

More specifically, the semiconductor chip 25 is disposed on the first principal surface of the wiring substrate 11 through an adhesive layer (not illustrated). Electrodes (not illustrated) of the semiconductor chip 25 are electrically connected to the first wiring layer 12 of the wiring substrate 11 through a bonding wire 46. The bonding wire 46 may be a conductive wire that connects the electrodes (not illustrated) of the semiconductor chip 25 to electrodes (in the first wiring layer 12) of the wiring substrate 11. Examples of the material of the bonding wire 46 may include gold (Au) and copper (Cu).

Similarly to the semiconductor device 10, the semiconductor device 40 includes the heat insulating layer 17, the thermal diffusion layer 18, the heat generating member 19, and the heating electrodes 28A and 28B. Thus, when the semiconductor device 40 is mounted on the substrate 200 (see FIG. 3), the semiconductor device 40 may be removed from substrate 200 using the apparatus 100 illustrated in FIG. 3 in accordance with the flowchart illustrated in FIG. 5A. When the semiconductor device 40 is to be mounted on the substrate 200 (see FIG. 3), the semiconductor device 40 may be mounted on the substrate 200 using the apparatus 100 illustrated in FIG. 3 in accordance with the flowchart illustrated in FIG. 5B. As a result, advantages similar to those of the first embodiment may be achieved.

Third Modification of First Embodiment

In a third modification of the first embodiment, by way of example, a semiconductor device having a structure different from that in the first embodiment and the first and second modifications thereof is provided. In the third modification of the first embodiment, portions having substantially the same configuration as those in the foregoing embodiment and modifications thereof will not be described.

Figure 9:
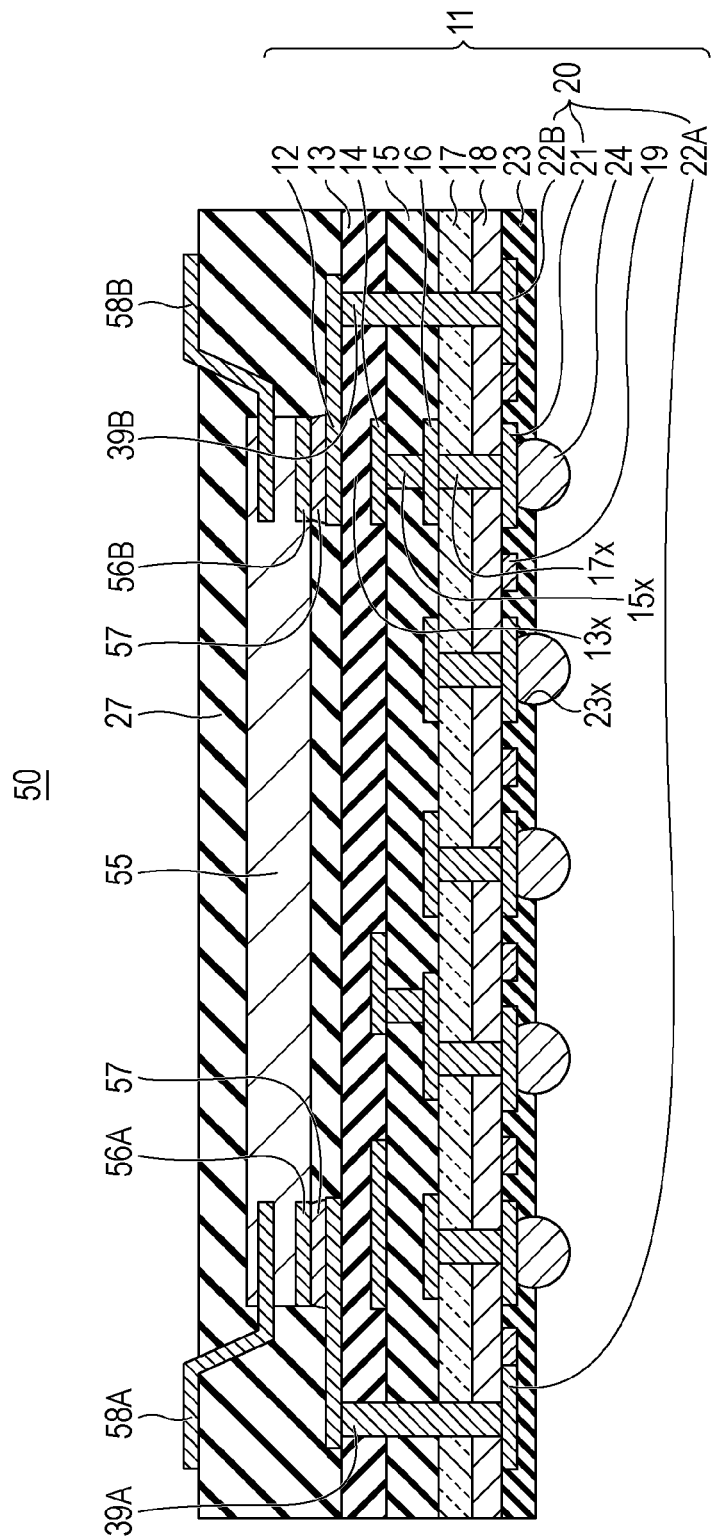
FIG. 9 is a cross-sectional view illustrating an example of a semiconductor device according to a third modification of the first embodiment.

FIG. 9 is a cross-sectional view illustrating an example of a semiconductor device according to the third modification of the first embodiment. Referring to FIG. 9, a semiconductor device 50 is different from the semiconductor device 10 (see FIG. 1) and the like in that two lead terminals of a semiconductor chip 55 packaged by resin sealing are used as heating electrodes 58A and 58B.

In the semiconductor device 50, the semiconductor chip 55 is packaged by resin sealing, and part of each of a plurality of lead terminals is led out from a resin sealing member. Two of the plurality of lead terminals are used as the heating electrodes 58A and 58B, and extend to the upper surface of the sealing member 27. The heating electrodes 58A and 58B are electrically connected to the internal electrodes 56A and 56B, respectively, by internal wires (not illustrated) formed in the resin sealing member. Each of the internal electrodes 56A and 56B is electrically connected to the first wiring layer 12 of the wiring substrate 11 via a solder 57. That is, the heating electrodes 58A and 58B are electrically connected to the heat generating member 19.

The heating electrodes 58A and 58B may be formed of metal plates such as copper alloy or 42 alloy plates. A plating film such as gold (Au) or tin (Sn) may be formed on a surface of the metal plates. Examples of the material of the internal electrodes 56A and 56B may include conductive materials such as copper (Cu) and aluminum (Al).

Examples of the material of the solders 57 may include a solder material having a higher melting point than the external connection terminals 24, such as Sn-95 Pb (with a melting point of approximately 270° C. to 330° C.), Sn-80Au (with a melting point of approximately 280° C. to 320° C.), or Sn-0.7 Cu (with a melting point of approximately 240° C. to 270° C.).

The solders 57 are formed of a solder material having a higher melting point than the external connection terminals 24, and a temperature at which the solders 57 are not melted but the external connection terminals 24 are melted is set when the semiconductor device 50 is to be removed from the substrate on which the semiconductor device 50 is mounted, thus allowing the semiconductor device 50 to be removed substantially without any influence on the solders 57. In addition, a temperature at which the solders 57 are not melted but the external connection terminals 24 are melted is set when the semiconductor device 50 is to be mounted on a substrate, thus allowing the semiconductor device 50 to be mounted substantially without any influence on the solders 57. In the semiconductor device 50 according to this embodiment, the heat insulating layer 17 blocks heat from being transferred from the external connection terminals 24 to the solders 57. Therefore, the solders 57 may be formed of the same material as that of the external connection terminals 24.

Similarly to the semiconductor device 10, the semiconductor device 50 includes the heat insulating layer 17, the thermal diffusion layer 18, the heat generating member 19, and the heating electrodes 58A and 58B instead of the heating electrodes 28A and 28B. Thus, when the semiconductor device 50 is mounted on the substrate 200 (see FIG. 3), the semiconductor device 50 may be removed from the substrate 200 using the apparatus 100 illustrated in FIG. 3 in accordance with the flowchart illustrated in FIG. 5A. When the semiconductor device 50 is to be mounted on the substrate 200 (see FIG. 3), the semiconductor device 50 may be mounted on the substrate 200 using the apparatus 100 illustrated in FIG. 3 in accordance with the flowchart illustrated in FIG. 5B. As a result, advantages similar to those of the first embodiment may be achieved.

Figure 10:
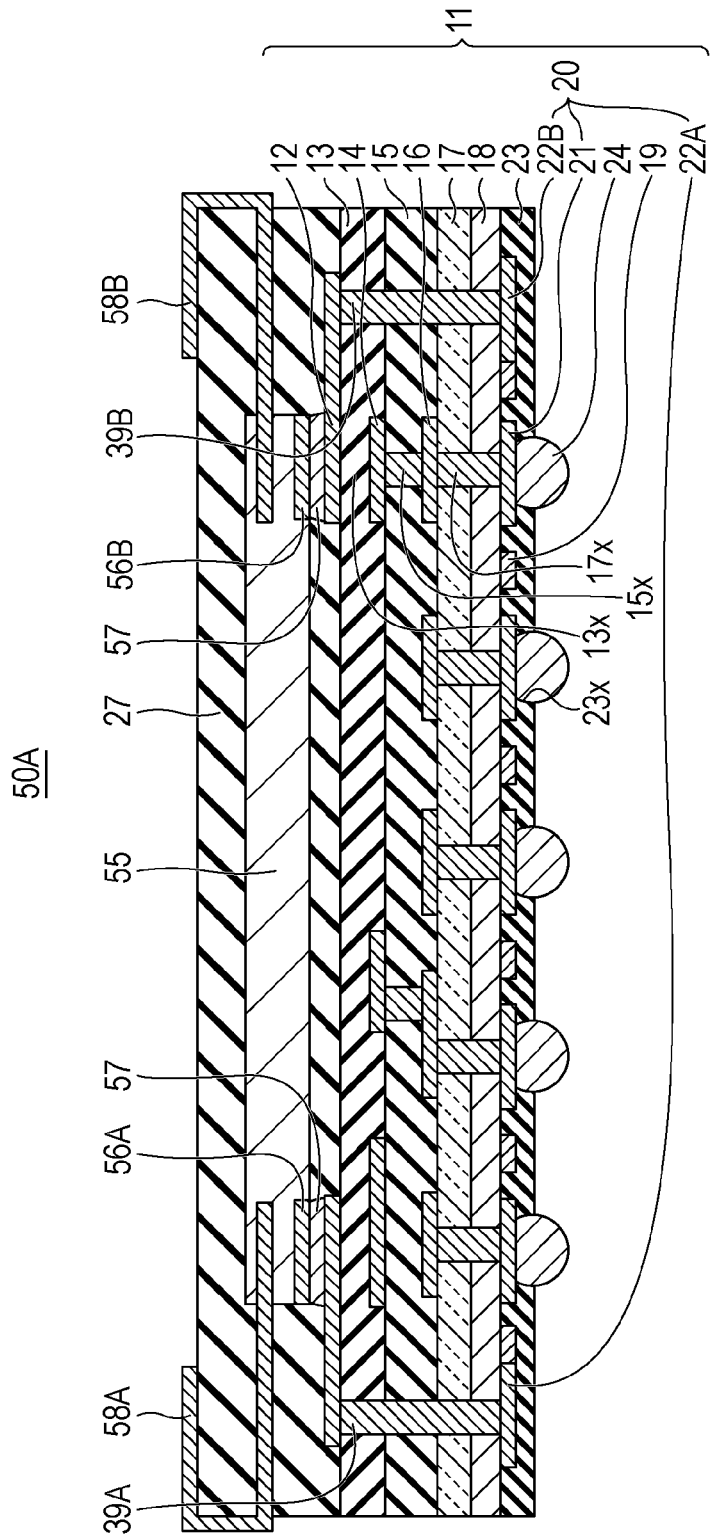
FIG. 10 is a cross-sectional view illustrating another example of the semiconductor device according to the third modification of the first embodiment.

As in a semiconductor device 50A illustrated in FIG. 10, the heating electrodes 58A and 58B may be formed by extending two of the lead terminals of the semiconductor chip 55 to the side surfaces and upper surface of the sealing member 27.

Second Embodiment

In the first embodiment and modifications thereof, heating electrodes are disposed on a surface of a sealing member, by way of example. In a second embodiment, heating electrodes are disposed on the external electrode side, by way of example. In the second embodiment, portions having substantially the same configuration as those in the foregoing embodiment and modifications thereof will not be described.

FIG. 11 is a cross-sectional view illustrating an example of a semiconductor device according to the second embodiment. FIG. 12A is a bottom view illustrating the example of the semiconductor device according to the second embodiment. FIG. 11 illustrates cross-section taken along line XI-XI in FIG. 12A. In FIG. 12A, the third insulating layer 23 is not illustrated for convenience of illustration.

Referring to FIGS. 11 and 12A, a semiconductor device 60 is different from the semiconductor device 10 (see FIG. 1) in that the heating electrodes 28A and 28B and the through-wires 29A and 29B are not provided and heating electrodes 68A and 68B are disposed on the internal electrodes 22A and 22B, respectively. That is, in the semiconductor device 10 (see FIG. 1), the heating electrodes 28A and 28B are disposed on a surface of the sealing member 27, whereas, in the semiconductor device 60, the heating electrodes 68A and 68B are disposed on the opposite side, that is, on the internal electrodes 22A and 22B, respectively. The heating electrodes 68A and 68B may be, for example, solder bumps, and may be formed of a material similar to that of the external connection terminals 24.

As illustrated in FIG. 13, the semiconductor device 60 may be connected to the apparatus 100 through the substrate 200 on which the semiconductor device 60 is mounted. That is, the nozzles 110A and 110B are abutted against wires on the substrate 200 which are electrically connected to the heating electrodes 68A and 68B, and a voltage may be applied to the heating electrodes 68A and 68B from the apparatus 100 via the wires on the substrate 200. The semiconductor device 60 may also be connected to the substrate 200 in a manner similar to that described above when the semiconductor device 60 is to be mounted on the substrate 200.

Similarly to the semiconductor device 10, the semiconductor device 60 includes the heat insulating layer 17, the thermal diffusion layer 18, the heat generating member 19, and the heating electrodes 68A and 68B instead of the heating electrodes 28A and 28B. Thus, when the semiconductor device 60 is mounted on the substrate 200 (see FIG. 3), the semiconductor device 60 may be removed from the substrate 200 using the apparatus 100 illustrated in FIG. 13 in accordance with the flowchart illustrated in FIG. 5A. In this embodiment, however, in step S10 illustrated in FIG. 5A, the nozzles 110A and 110B are abutted against the wires on the substrate 200, and a voltage is started to be applied. Further, in step S18, the nozzles 110A and 110B are released from the wires on the substrate 200 and are moved to above the upper surface of the semiconductor device 60. Then, the nozzles 110A and 110B are abutted against the upper surface of the semiconductor device 60, and the upper surface of the semiconductor device 60 is subjected to suction. After the semiconductor device 60 is moved from the substrate 200, the suction is stopped.

When the semiconductor device 60 is to be mounted on the substrate 200 (see FIG. 3), the semiconductor device 60 may be mounted on the substrate 200 using the apparatus 100 illustrated in FIG. 13 in accordance with the flowchart illustrated in FIG. 5B. In this embodiment, however, in step S30 illustrated in FIG. 5B, the nozzles 110A and 110B are abutted against the upper surface of the semiconductor device 60, and the upper surface of the semiconductor device 60 is subjected to suction. After the semiconductor device 60 is placed at a predetermined position on the substrate 200, the suction is stopped. Further, in step S10, the nozzles 110A and 110B are released from the upper surface of the semiconductor device 60 and are moved to above the wires on the substrate 200. Then, the nozzles 110A and 110B are abutted against the wires on the substrate 200, and a voltage is started to be applied.

In this case, since only the semiconductor device 60 is heated, only the semiconductor device 60 may be mounted or removed without removing or damaging other components around the semiconductor device 60. Since the semiconductor device 60 includes the heat insulating layer 17, which may keep heat generated by the heat generating member 19 from being transferred to the semiconductor chip 25 side, the semiconductor chip 25 (or electronic component body) may be protected from being damaged by heat. As a result, failure analysis of the semiconductor device 60 that has been removed may be made. Since the semiconductor device 60 includes the heat insulating layer 17, heat generated by the heat generating member 19 and diffused uniformly by the thermal diffusion layer 18 may be efficiently transmitted to the external connection terminals 24 without dissipation.

In the second embodiment, therefore, by providing heating electrodes on the external electrode side (or on the second principal surface side), advantages similar to those in the first embodiment may be achieved. Similar advantages may also be achieved if, in FIGS. 6, 7, 8, 9, and 10, the heating electrodes 28A and 28B are not disposed on a surface of the sealing member 27 but the heating electrodes 68A and 68B are disposed on the opposite side, that is, on the internal electrodes 22A and 22B, respectively.

The heat generating member 19 may not necessarily have the pattern illustrated in FIG. 12A, and may have any other pattern as long as the heat generating member 19 is turned around on an entire surface of the thermal diffusion layer 18. For example, the heat generating member 19 may have a pattern illustrated in FIG. 12B or 12C in which the heat generating member 19 meanders around the external connection terminals 24. The heat generating member 19 may have any other suitable pattern. As illustrated in FIGS. 12B and 12C, some of the external connection terminals 24 disposed in an area array pattern (which are not used for a signal line or the like) may be used as the heating electrodes 68A and 68B. This configuration allows a reduction in the size of the semiconductor device 60. As illustrated in FIG. 12C, a plurality of external connection terminals 24 among the external connection terminals 24 that are disposed in an area array pattern (which are not used for a signal line or the like) may be connected in parallel and used as heating electrodes 68A, and a plurality of external connection terminals 24 among the external connection terminals 24 that are disposed in an area array pattern (which are not used for a signal line or the like) may be connected in parallel and used as heating electrodes 68B. This configuration allows an increase in the reliability of connection between the semiconductor device 60 and the substrate 200.

Third Embodiment

In the foregoing embodiments and modifications thereof, a heat generating member is disposed on a surface of a thermal diffusion layer, by way of example. In a third embodiment, a heat insulating layer and a heat generating member are disposed in a through-hole formed in a semiconductor device, by way of example. In the third embodiment, portions having substantially the same configuration as those in the foregoing embodiments and modifications thereof will not be described.

Figure 14:
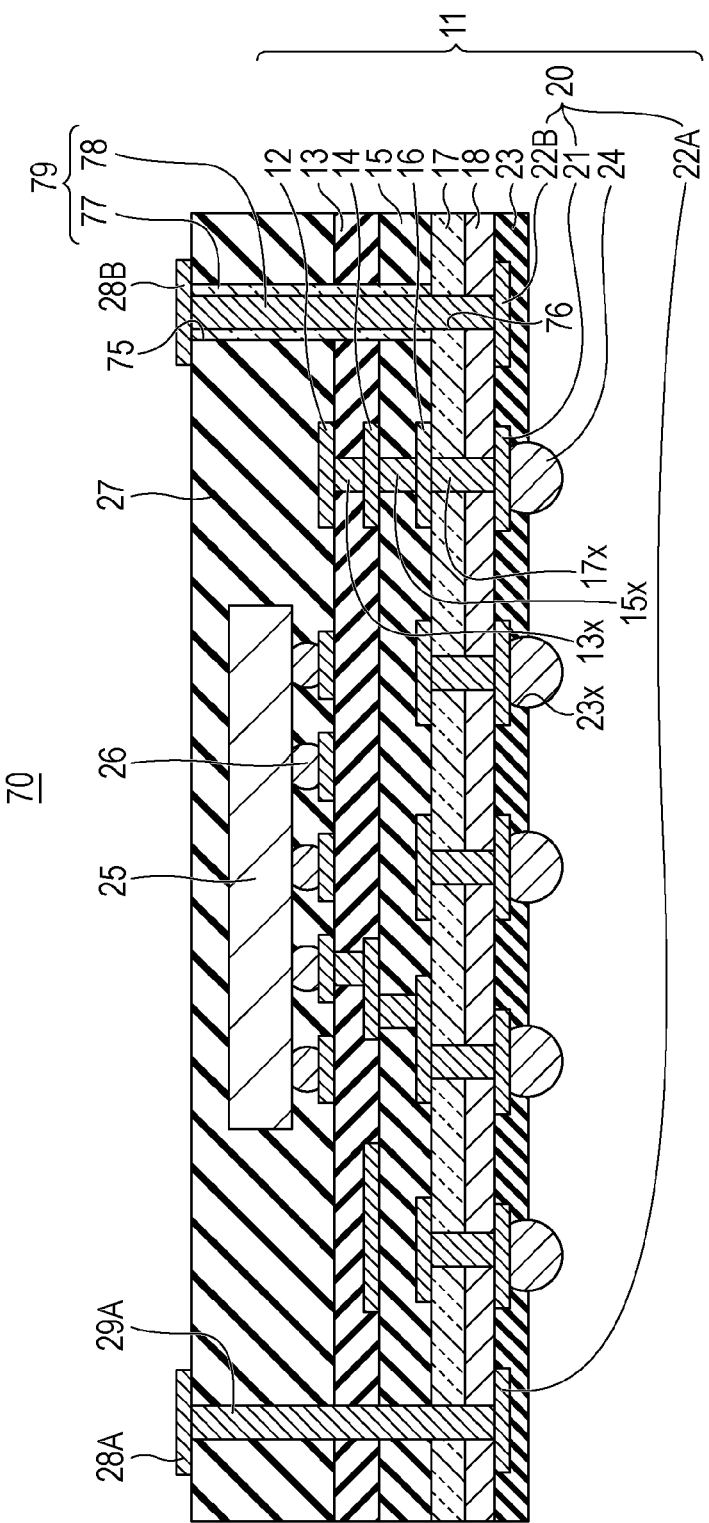
FIG. 14 is a cross-sectional view illustrating an example of a semiconductor device according to a third embodiment.

FIG. 14 is a cross-sectional view illustrating an example of a semiconductor device according to the third embodiment. Referring to FIG. 14, unlike the semiconductor device 10 (see FIG. 1) and the like in which the heat generating member 19 is disposed on a surface of the thermal diffusion layer 18, a semiconductor device 70 is configured such that a through-wire 79 including a heat insulating layer 77 and a heat generating member 78 is disposed in a through-hole extending through part of the semiconductor device 70.

More specifically, the semiconductor device 70 has a first through-hole 75 extending through the sealing member 27 and layers nearer the first principal surface of the wiring substrate 11 than the heat insulating layer 17, i.e., the first insulating layer 13 and the second insulating layer 15. The semiconductor device 70 also has a second through-hole 76 formed in the wiring substrate 11 which has a smaller diameter than the first through-hole 75. The second through-hole 76 communicates with the first through-hole 75, and extends through the heat insulating layer 17 and the thermal diffusion layer 18. The heat generating member 78 is disposed in the first through-hole 75 so as not to be in contact with the inner wall of the first through-hole 75, and the heat insulating layer 77 is disposed so as to surround the heat generating member 78. The heat generating member 78 fills the second through-hole 76.

The heating electrode 28B is electrically connected to an end of the heat generating member 78, and the internal electrode 22B is electrically connected to the other end of the heat generating member 78. The internal electrodes 22A and 22B are electrically connected to each other via a wire (not illustrated) in the wiring substrate 11.

Examples of the material of the heat insulating layer 77 may include polyimide resin. Examples of the material of the heat generating member 78 may include polypyrrole. The through-wire 79 may be formed by the following steps: For example, the first through-hole 75 that extends through the sealing member 27, the first insulating layer 13, and the second insulating layer 15 and that allows a surface of the heat insulating layer 17 to be exposed is formed. The first through-hole 75 is filled with a polyimide resin. A through-hole that extends through the polyimide resin filled into the first through-hole 75, the heat insulating layer 17, and the thermal diffusion layer 18 and that allows a surface of the internal electrode 22B to be exposed is formed so as not to allow the inner wall surface of the first through-hole 75 to be exposed. The through-hole formed in the heat insulating layer 17 and the thermal diffusion layer 18 is the second through-hole 76. Then, the first through-hole 75 having the inner wall surface coated with the polyimide resin, and the second through-hole 76 communicating with the first through-hole 75 are filled with polypyrrole. Therefore, the heat generating member 78 that is surrounded by polyimide resin in the first through-hole 75 and that is filled into the second through-hole 76 is formed.

Examples of the material of the heat insulating layer 77 may include carbon nanotubes. After the first through-hole 75 and the second through-hole 76 described above are formed in advance, the carbon nanotubes may be formed into a substantially annular shape, when viewed in plan, around the second through-hole 76 within the first through-hole 75, when viewed in plan, so that the long transverse direction of the carbon nanotubes is substantially perpendicular to the thermal diffusion layer 18 and the like. Carbon nanotubes exhibit small thermal resistance in their long transverse direction and large thermal resistance in their short transverse direction. Thus, carbon nanotubes formed so that their long transverse direction is substantially perpendicular to the thermal diffusion layer 18 and the like may not allow heat generated by the heat generating member 78 to be transmitted to the surrounding environment. Examples of the material of the heat generating member 78 may include polypyrrole, and polypyrrole may be filled into the substantially annular segments of carbon nanotubes and into the second through-hole 76.

The semiconductor device 70 includes the heat insulating layers 17 and 77, the thermal diffusion layer 18, the heat generating member 78, and the heating electrodes 28A and 28B. Thus, when the semiconductor device 70 is mounted on the substrate 200 (see FIG. 3), the semiconductor device 70 may be removed from the substrate 200 using the apparatus 100 illustrated in FIG. 3 in accordance with the flowchart illustrated in FIG. 5A. That is, in the semiconductor device 70, heat generated by causing a current to flow through the heat generating member 78 is transmitted to the thermal diffusion layer 18 that is in contact with the heat generating member 78, is diffused uniformly by the thermal diffusion layer 18, and heats the external connection terminals 24. As a result, the external connection terminals 24 are melted, and the semiconductor device 70 may be removed from the substrate 200. When the semiconductor device 70 is to be mounted on the substrate 200 (see FIG. 3), the semiconductor device 70 may be mounted on the substrate 200 using the apparatus 100 illustrated in FIG. 3 in accordance with the flowchart illustrated in FIG. 5B.

In this case, since only the semiconductor device 70 is heated, only the semiconductor device 70 may be mounted or removed without removing or damaging other components around the semiconductor device 70. Since the semiconductor device 70 includes the heat insulating layers 17 and 77, which may keep heat generated by the heat generating member 78 from being transferred to the semiconductor chip 25 side, the semiconductor chip 25 (or electronic component body) may be protected from being damaged by heat. As a result, failure analysis of the semiconductor device 70 that has been removed may be made. Since the semiconductor device 70 includes the heat insulating layers 17 and 77, heat generated by the heat generating member 78 may be efficiently transmitted to the external connection terminals 24 without dissipation.

In the third embodiment, therefore, by providing a heat generating member in a through-hole formed in a semiconductor device, advantages similar to those in the first embodiment may be achieved. Similar advantages may also be achieved if, in FIGS. 6, 7, 9, and 10, each of the through-wires 39A and 39B includes the heat insulating layer 77 and the heat generating member 78 without placing the heat generating member 19 on a surface of the thermal diffusion layer 18. Similar advantages may also be achieved if, in FIG. 8, each of the through-wires 29A and 29B includes the heat insulating layer 77 and the heat generating member 78 without placing the heat generating member 19 on a surface of the thermal diffusion layer 18.

Fourth Embodiment

In the foregoing embodiments and modifications thereof, heat is generated by causing a current to flow through a heat generating member, by way of example. In a fourth embodiment, heat is supplied from outside a semiconductor device through heating electrodes, and the supplied heat is held in a heat generating member, by way of example. In the fourth embodiment, portions having substantially the same configuration as those in the foregoing embodiments and modifications thereof will not be described.

Figure 15:
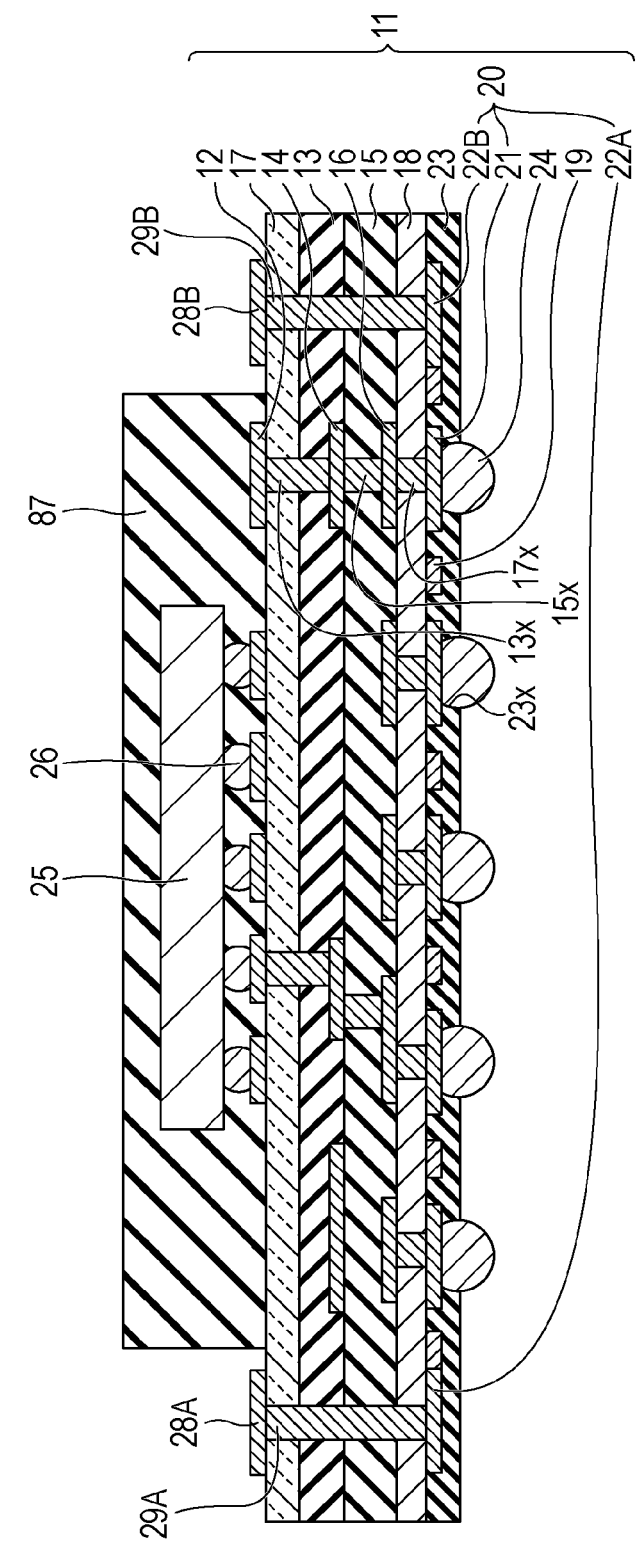
FIG. 15 is a cross-sectional view illustrating an example of a semiconductor device according to a fourth embodiment.

FIG. 15 is a cross-sectional view illustrating an example of a semiconductor device according to the fourth embodiment. Referring to FIG. 15, a semiconductor device 80 is different from the semiconductor device 10 (see FIG. 1) in that the heat insulating layer 17 is disposed in an outermost layer (or in a layer nearest to the semiconductor chip 25) on the first principal surface side of the wiring substrate 11 and that the sealing member 27 is replaced by a sealing member 87.

The sealing member 87 is disposed in a portion of the first principal surface (or in a portion of a surface of the heat insulating layer 17) of the wiring substrate 11 so as to seal the semiconductor chip 25. Similarly to the sealing member 27, examples of the material of the sealing member 87 may include an insulating resin containing an epoxy resin as a main component. A portion of the heat insulating layer 17 is exposed from the sealing member 87, and the heating electrodes 28A and 28B are disposed in the portion of the heat insulating layer 17 which is exposed from the sealing member 87.

The heating electrodes 28A and 28B are thermally connected to the heat generating member 19 via the through-wires 29A and 29B extending through the heat insulating layer 17, the first insulating layer 13, the second insulating layer 15, and the thermal diffusion layer 18, and also via the internal electrodes 22A and 22B. The term "thermally connecting" means connecting using a high thermal conductivity material. No problem would occur if thermal connection and electrical connection are established simultaneously as a result of selecting a conductive material as a high thermal conductivity material.

Similarly to the sealing member 27 (see FIG. 1), the sealing member 87 may be formed on the entirety of the first principal surface (or on an entire surface of the heat insulating layer 17) of the wiring substrate 11, and the heating electrodes 28A and 28B may be disposed on the sealing member 87. In this structure, however, heat supplied from outside the semiconductor device 80 via the heating electrodes 28A and 28B is also transmitted to the sealing member 87. Thus, it is desirable that the sealing member 87 be formed of a resin material having a high heat resistance. In other words, the structure illustrated in FIG. 15 may be more desirable because of the absence of the above constraint.

Figure 16:
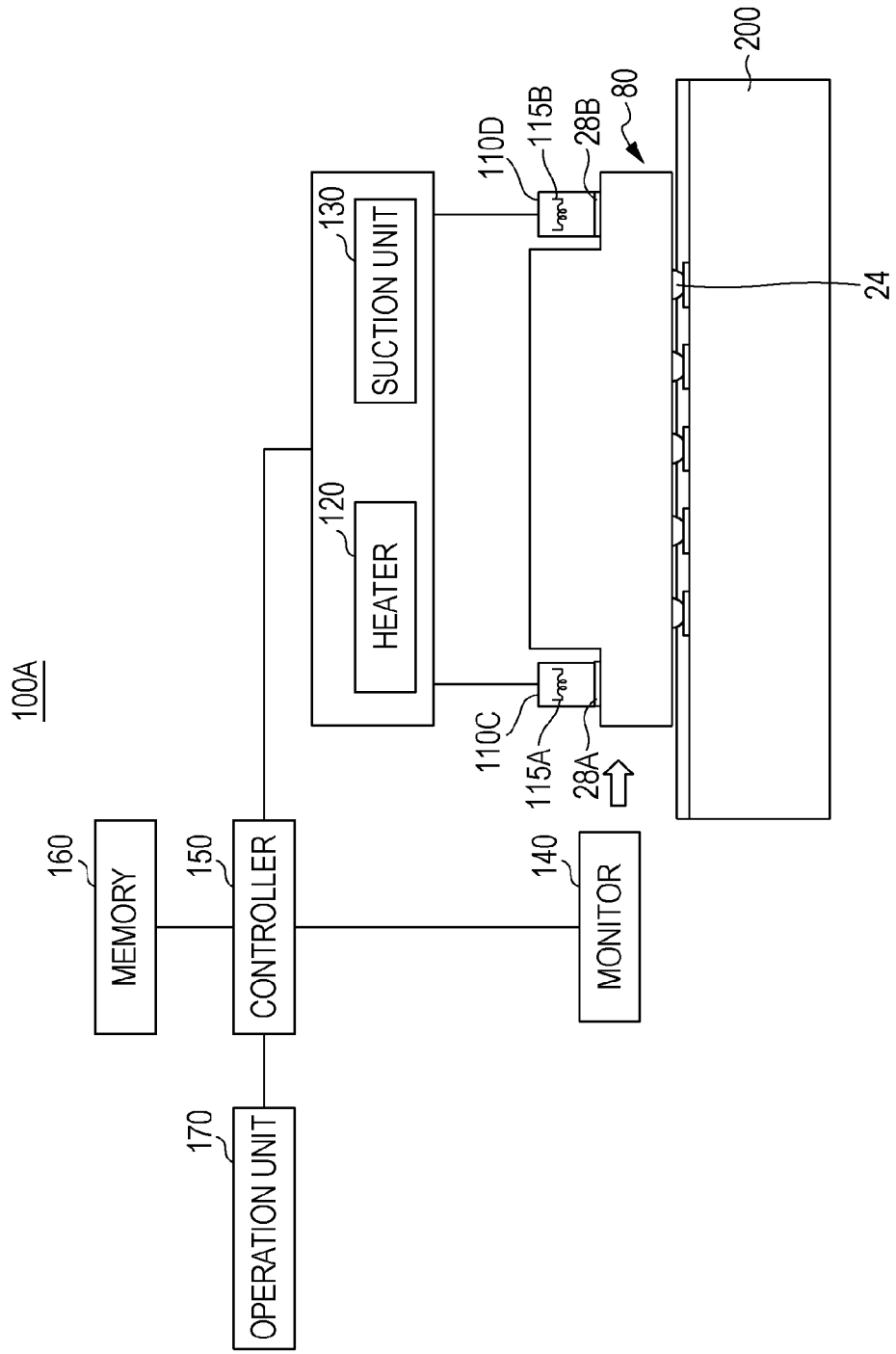
FIG. 16 is a schematic view illustrating still another example of the apparatus that is used to mount and remove a semiconductor device.

Nozzles 110C and 110D of an apparatus 100A illustrated in FIG. 16 are abutted against the heating electrodes 28A and 28B, respectively, when the semiconductor device 80 is to be removed from the substrate 200 on which the semiconductor device 80 is mounted. Similarly to the nozzles 110A and 110B, the nozzles 110C and 110D may be, for example, substantially circularly cylindrical members having through-holes in center portions thereof so as to extend from the top to the bottom thereof, the through-holes being circular when viewed in plan. However, unlike the nozzles 110A and 110B, the nozzles 110C and 110D include heat generators 115A and 115B, respectively. The heat generators 115A and 115B may be formed of, for example, nichrome (Ni—Cr) lines, tungsten (W) lines, or the like. The nozzles 110C and 110D are typical examples of an abutting unit according to the present disclosure. The nozzles 110C and 110D (or abutting units), the heater 120, and the suction unit 130 are typical examples of elements included in an electronic component assembly apparatus according to the present disclosure.

The controller 150 causes the nozzles 110C and 110D to generate heat by supplying a current to the heat generators 115A and 115B. The heat generated by the nozzles 110C and 110D is supplied to the heat generating member 19 through the heating electrodes 28A and 28B to cause the heat generating member 19 to generate heat. The heat generated by the heat generating member 19 is diffused uniformly by the thermal diffusion layer 18, and the thermal diffusion layer 18 exhibits a substantially constant temperature. As in the other embodiments and modifications thereof, the heat may be efficiently transmitted to the plurality of external connection terminals 24, and the plurality of external connection terminals 24 are melted. Similar processing may be performed when the semiconductor device 80 is to be mounted on the substrate 200.

In this embodiment, in step S10 illustrated in FIGS. 5A and 5B, the controller 150 causes current to flow through the heat generators 115A and 115B included in the nozzles 110C and 110D, respectively, to heat the heat generators 115A and 115B (i.e., no current flows through the heat generating member 19). That is, the controller 150 does not perform the operation of commanding the heater 120 to set the potential difference between the nozzles 110C and 110D to a certain value. In this embodiment, in steps S13, S14, and S17 illustrated in FIGS. 5A and 5B, the current flowing through the heat generators 115A and 115B included in the nozzles 110C and 110D, respectively, rather than the current flowing through the heat generating member 19, is controlled.

In this embodiment, since no current is caused to flow through the heat generating member 19 via the nozzles 110C and 110D, there is no need to generate a potential difference between the nozzles 110C and 110D. Therefore, only one of the nozzles 110C and 110D may be used if the supply of a sufficient amount of heat is allowed. If the supply of a sufficient amount of heat is not allowed, the number of nozzles may be increased. The nozzles 110C and 110D may not necessarily be formed of a conductive material, and may be formed of, for example, ceramic or the like.

In the fourth embodiment, therefore, unlike the other embodiments and modifications thereof, the heat generating member 19 is caused to generate heat by supplying heat to the heat generating member 19 from the outside rather than by causing a current to flow through the heat generating member 19. This method may also achieve advantages similar to those in the first embodiment.

The heat insulating layer 17 is disposed in an outermost layer (or in a layer nearest to the semiconductor chip 25) on the first principal surface side of the wiring substrate 11. Thus, heat supplied from the heating electrodes 28A and 28B may not be allowed to be transmitted to the semiconductor chip 25 (or electronic component body).

Fifth Embodiment

In the foregoing embodiments and modifications thereof, by way of example, a semiconductor device includes a heat insulating layer, a thermal diffusion layer, a heat generating member, and heating electrodes. In a fifth embodiment, by way of example, a ceramic capacitor as an example of an electronic component other than a semiconductor device includes a heat insulating layer, a thermal diffusion layer, a heat generating member, and heating electrodes.

Figure 17:
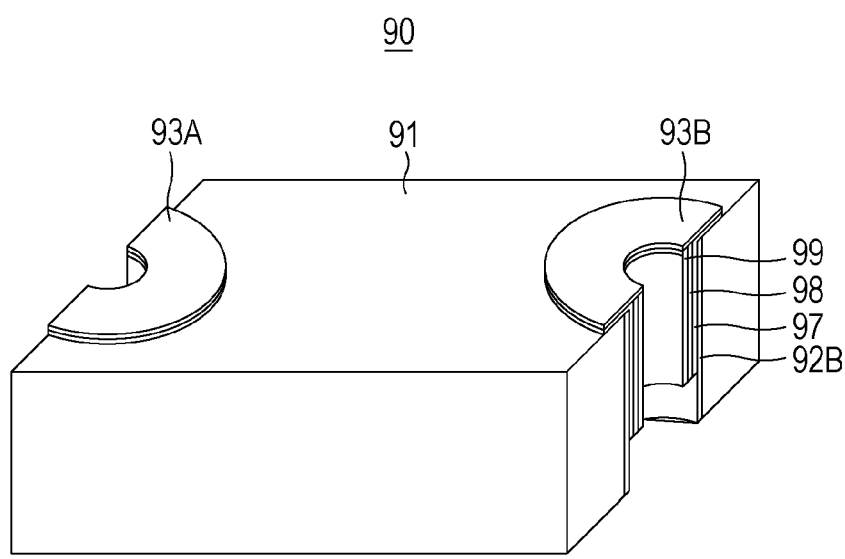
FIG. 17 is a perspective view illustrating an example of an electronic component according to a fifth embodiment.
Figure 18:
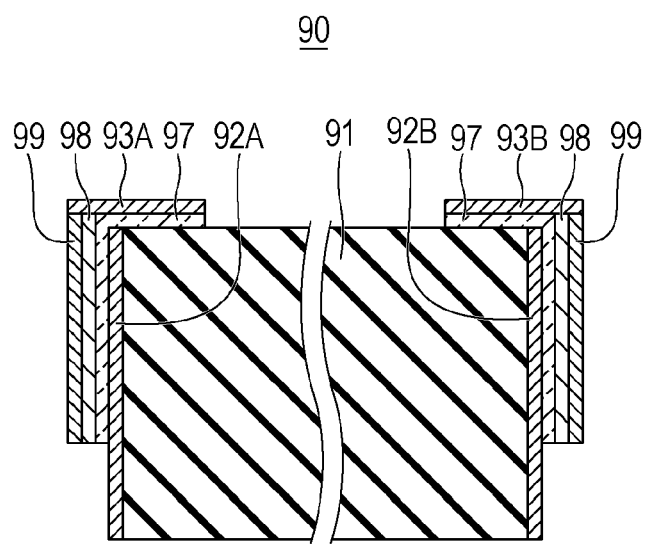
FIG. 18 is a cross-sectional view illustrating an example of the electronic component according to the fifth embodiment.

FIG. 17 is a perspective view illustrating an example of an electronic component according to the fifth embodiment. FIG. 18 is a cross-sectional view illustrating the example of the electronic component according to the fifth embodiment. While in this embodiment, an electronic component will be described in the context of a ceramic capacitor, any other electronic component such as a resistor or an inductor may also be used.

Referring to FIGS. 17 and 18, an electronic component 90 may be a ceramic capacitor including an electronic component body 91, external electrodes 92A and 92B, heating electrodes 93A and 93B, heat insulating layers 97, thermal diffusion layers 98, and heat generating members 99. The electronic component body 91 includes a dielectric (not illustrated) and internal electrodes (not illustrated).

The external electrodes 92A and 92B are formed in both edge portions of the electronic component body 91. The external electrodes 92A and 92B are electrodes used during the normal operation of the electronic component 90 (or when the electronic component 90 serves as a capacitor). The external electrodes 92A and 92B are electrodes that are electrically connected to the electronic component body 91 and that are electrically connectable to an external connection terminal (or a solder 301 described below).

In a region that is part of each of the external electrodes 92A and 92B, the heat insulating layer 97, the thermal diffusion layer 98, and the heat generating member 99 are stacked in this order. The heat insulating layers 97 are also formed in both edge portions on an upper surface of the electronic component body 91 so as to extend in a direction substantially perpendicular to the external electrodes 92A and 92B. The heat insulating layers 97, the thermal diffusion layers 98, and the heat generating members 99 have functions similar to those of the heat insulating layer 17, the thermal diffusion layer 18, and the heat generating member 19, respectively. The heat insulating layers 97, the thermal diffusion layers 98, and the heat generating members 99 may be formed of materials similar to the materials of the heat insulating layer 17, the thermal diffusion layer 18, and the heat generating member 19, respectively.

The heating electrodes 93A and 93B are formed on the heat insulating layers 97 that extend in the direction substantially perpendicular to the external electrodes 92A and 92B. In addition, the heating electrodes 93A and 93B are in contact with portions of the thermal diffusion layers 98 and the heat generating members 99. The heating electrodes 93A and 93B are electrodes used for the mounting or removal of the electronic component 90. The external electrodes 92A and 92B and the heating electrodes 93A and 93B may be formed of materials similar to the materials of the external electrodes 21 and the heating electrodes 28A and 28B, respectively.

Figure 19:
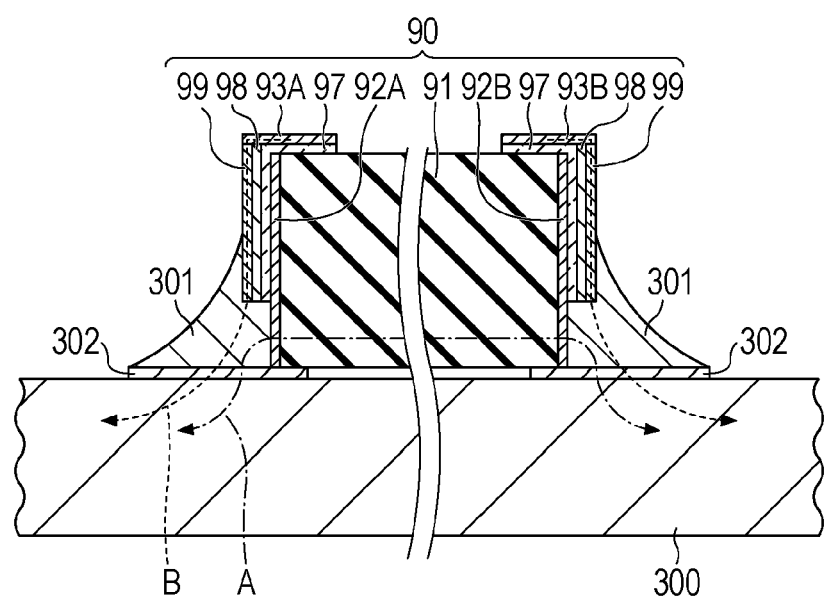
FIG. 19 is a diagram illustrating current flow in the electronic component according to the fifth embodiment.

FIG. 19 is a diagram illustrating current flow in the electronic component according to the fifth embodiment. In FIG. 19, the electronic component 90 is mounted on a pad 302 on a substrate 300 via a solder 301 serving as an external connection terminal. The solder 301 electrically connects portions of the external electrodes 92A and 92B which are exposed from the heat insulating layers 97 and the like and portions of the heat generating members 99 to the pad 302 on the substrate 300. That is, the portions of the heat generating members 99 also serve as external electrodes.

During the normal operation of the electronic component 90, as indicated by an arrow A, a current flows through the external electrode 92A, the electronic component body 91, and the external electrode 92B. Therefore, the electronic component 90 serves as a capacitor. When the electronic component 90 mounted on the substrate 300 is to be removed, the nozzles 110A and 110B of the apparatus 100 illustrated in FIG. 3 are abutted against the heating electrodes 93A and 93B, respectively. As indicated by an arrow B, a current flows from the heating electrodes 93A and 93B to the wiring substrate 300 through the heat generating members 99. It is desirable that the wiring of the wiring substrate 300 be designed so that the potential of the pad 302 on the wiring substrate 300 is lower than the potential between the nozzles 110A and 110B.

Therefore, a current flows through the heat generating members 99 and heat is generated. The generated heat is diffused uniformly by the thermal diffusion layers 98, and heats and melts the solder 301 serving as an external connection terminal. As a result, the electronic component 90 may be removed from the substrate 300. In this case, since only the electronic component 90 is heated, only the electronic component 90 may be removed without removing or damaging other components around the electronic component 90.

The electronic component 90 includes the heat insulating layers 97 in both edge portions thereof on the electronic component body 91 side with respect to the thermal diffusion layers 98. Since the heat insulating layers 97 may keep heat generated by the heat generating members 99 and diffused uniformly by the thermal diffusion layers 98 from being transferred to the electronic component body 91, the electronic component body 91 may be protected from being damaged by heat. As a result, failure analysis of the electronic component 90 that has been removed may be made.

Since the electronic component 90 includes the heat insulating layers 97, heat generated by the heat generating members 99 and diffused uniformly by the thermal diffusion layers 98 may be efficiently transmitted to the solder 301 without dissipation. The electronic component 90 may also be mounted using a similar method.

Other Types of Nozzles

In the foregoing embodiments and the modifications thereof, the nozzles 110A and 110B illustrated in FIG. 4 are generally used, by way of example. Other examples of nozzles are illustrated.

FIGS. 20A to 20D are perspective views illustrating other examples of nozzles. In the foregoing embodiments and the modifications thereof (except the fourth embodiment), a nozzle 111 illustrated in FIG. 20A may be used in place of the nozzles 110A and 110B illustrated in FIG. 4.

The nozzle 111 illustrated in FIG. 20A is a substantially circularly cylindrical member having a through-hole 111$x$ in a center portion thereof so as to extend from the top to the bottom thereof, the through-hole 111$x$ being circular when viewed in plan. The through-hole 111$x$ has a function similar to that of the through-holes 110A$x$ and 110B$x$, and a description thereof is thus omitted. The nozzle 111 has a positive electrode 111A and a negative electrode 111B, and the positive electrode 111A and the negative electrode 111B are insulated from each other through an insulating member 111C. The positive electrode 111A and the negative electrode 111B are configured to be abutted against adjacent heating electrodes 28A and 28B, respectively. The heating electrodes 28A and 28B are typical examples of a first electrode and a second electrode according to the present disclosure, respectively. However, either of the heating electrodes 28A and 28B may be the first electrode.

The positive electrode 111A and the negative electrode 111B may be formed of a conductive material such as copper (Cu) or aluminum (Al). The insulating member 111C may be formed of, for example, a thermosetting resin containing an epoxy resin as a main component. The nozzle 111 may be fabricated by, for example, separately fabricating the positive electrode 111A and the negative electrode 111B, disposing the insulating member 111C between the fabricated positive electrode 111A and negative electrode 111B, and pressing the insulating member 111C from both sides while heating the insulating member 111C.

The nozzle 111 is a typical example of an abutting unit according to the present disclosure. The positive electrode 111A and the negative electrode 111B are typical examples of a first conductive unit and a second conductive unit according to the present disclosure, respectively. However, either of the positive electrode 111A and the negative electrode 111B may be the first conductive unit. The heater 120 may generate a potential difference between the positive electrode 111A and the negative electrode 111B.

With the structure in which the positive electrode 111A and the negative electrode 111B are insulated from each other by the insulating member 111C, the functions of the nozzles 110A and 110B may be implemented by the single nozzle 111.

Figure 20B:
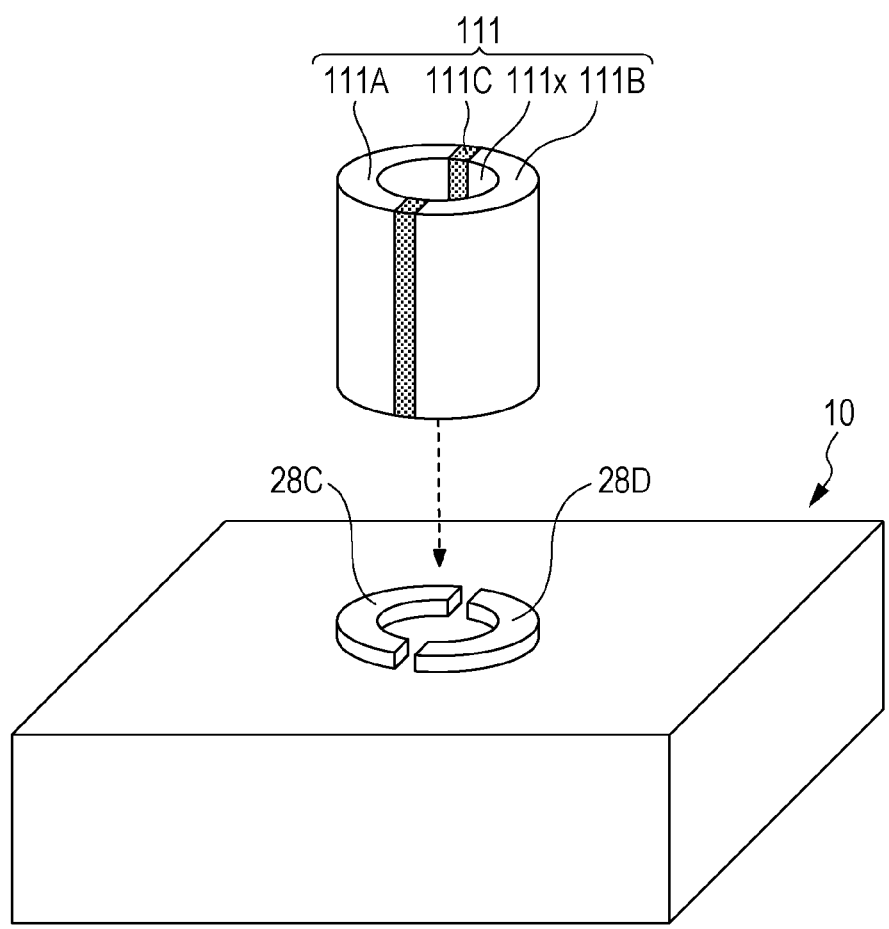
FIG. 20B is a perspective view illustrating still another example of nozzles.

In FIG. 20A, each of the heating electrodes 28A and 28B has a rectangular shape in plan view. Instead, for example, as illustrated in FIG. 20B, heating electrodes 28C and 28D that are substantially semi-annular in plan view and that are disposed so that the centers of the substantially semi-annular heating electrodes 28C and 28D face each other may be used. Heating electrodes each having any suitable shape other than a rectangular shape or semi-annular shape in plan view may be used. The heating electrodes 28C and 28D are typical examples of a first electrode and a second electrode according to the present disclosure, respectively. However, either of the heating electrodes 28C and 28D may be the first electrode.

Figure 20C:
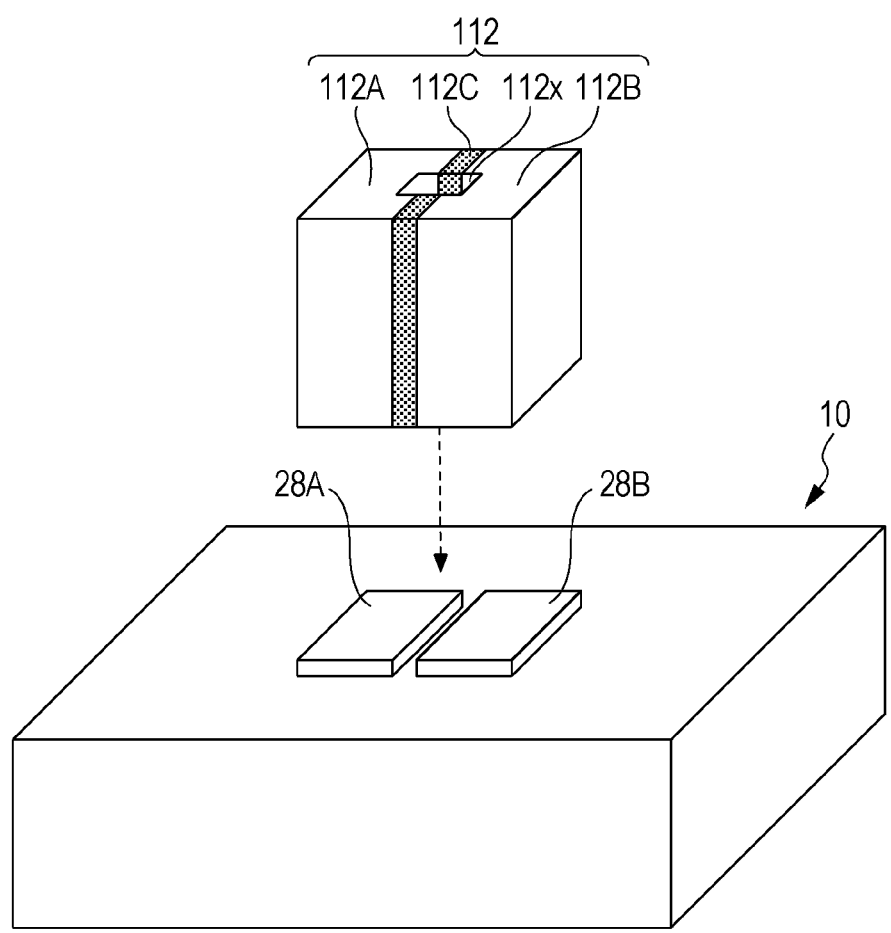
FIG. 20C is a perspective view illustrating still another example of nozzles.

A nozzle 112 illustrated in FIG. 20C is a substantially rectangular cylindrical member having a through-hole 112x in a center portion thereof so as to extend from the top to the bottom thereof, the through-hole 112x being rectangular when viewed in plan. The through-hole 112x has a function similar that of the through-holes 110Ax and 110Bx, and a description thereof is thus omitted. The nozzle 112 has a positive electrode 112A and a negative electrode 112B, and the positive electrode 112A and the negative electrode 112B are insulated from each other through an insulating member 112C. The positive electrode 112A and the negative electrode 112B are configured to be abutted against adjacent heating electrodes 28A and 28B, respectively.

The positive electrode 112A, the negative electrode 112B, and the insulating member 112C may be formed of materials similar to the materials of the positive electrode 111A, the negative electrode 111B, and the insulating member 111C, respectively. The nozzle 112 may be fabricated using a method similar to that of the nozzle 111.

The nozzle 112 is a typical example of an abutting unit according to the present disclosure. The positive electrode 112A and the negative electrode 112B are typical examples of a first conductive unit and a second conductive unit according to the present disclosure, respectively. However, either of the positive electrode 112A and the negative electrode 112B may be the first conductive unit. The heater 120 may generate a potential difference between the positive electrode 112A and the negative electrode 112B.

Accordingly, the shape of a nozzle is not limited to a substantially circularly cylindrical shape, and may be a substantially rectangular cylindrical shape. A nozzle may have any shape other than a substantially circularly cylindrical shape or a substantially cylindrical member shape.

Figure 20D:
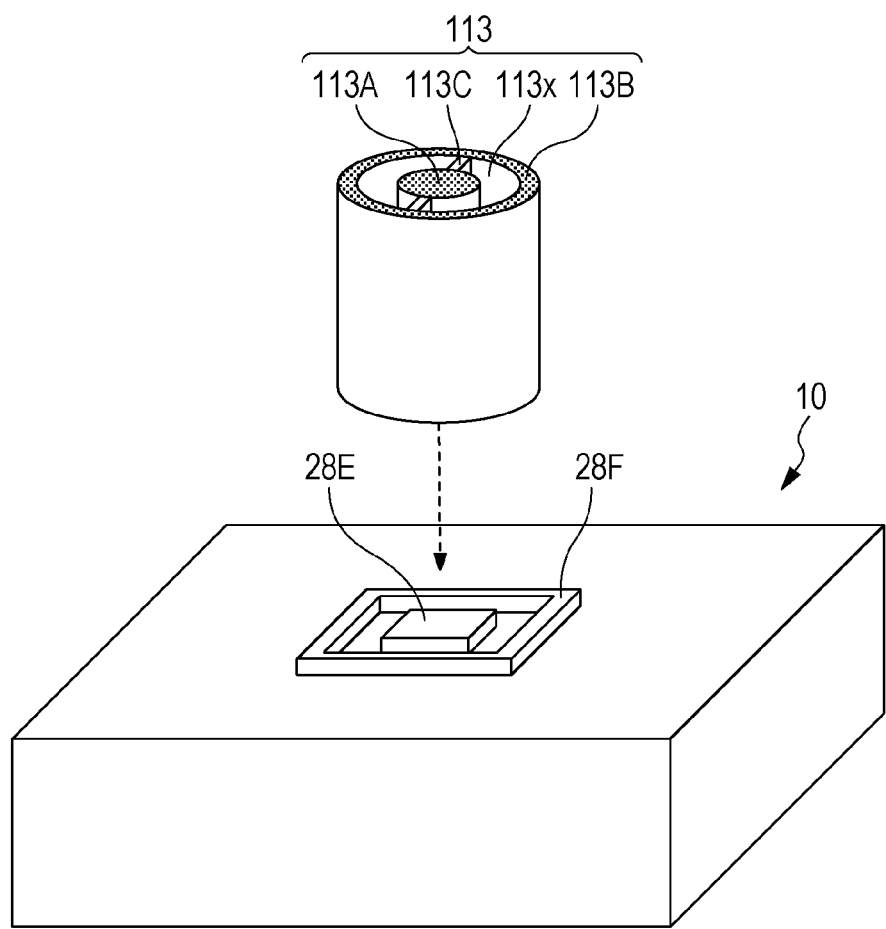
FIG. 20D is a perspective view illustrating still another example of nozzles.

A nozzle 113 illustrated in FIG. 20D has a substantially circularly cylindrical positive electrode 113A disposed in a center portion thereof, and a substantially annular cylindrical negative electrode 113B disposed annularly around the positive electrode 113A. The positive electrode 113A and the negative electrode 113B are disposed concentrically to each other via a through-hole 113x. The nozzle 113 further has an insulating member 113C, portions of which are disposed in the through-hole 113x so as to couple the positive electrode 113A to the negative electrode 113B. The through-hole 113x has a function similar to that of the through-holes 110Ax and 110Bx, and a description thereof is thus omitted. The positive electrode 113A and the negative electrode 113B are configured to be abutted against heating electrodes 28E and 28F which are concentric to each other.

The heating electrode 28E is substantially rectangular in plan view, and the heating electrode 28F is frame-shaped in plan view. A space is formed between the heating electrodes 28E and 28F, and the heating electrodes 28E and 28F are insulated from each other. The heating electrodes 28E and 28F are typical examples of a first electrode and a second electrode according to the present disclosure, respectively. However, either of the heating electrodes 28E and 28F may be the first electrode.

The positive electrode 113A, the negative electrode 113B, and the insulating member 113C may be formed of materials similar to the materials of the positive electrode 111A, the negative electrode 111B, and the insulating member 111C, respectively. The nozzle 113 may be fabricated by, for example, separately fabricating the positive electrode 113A and the negative electrode 113B and adhering the positive electrode 113A and the negative electrode 113B to each other using the insulating member 113C.

The nozzle 113 is a typical example of an abutting unit according to the present disclosure. The positive electrode 113A and the negative electrode 113B are typical examples of a first conductive unit and a second conductive unit according to the present disclosure, respectively. However, either of the positive electrode 113A and the negative electrode 113B may be the first conductive unit. The heater 120 may generate a potential difference between the positive electrode 113A and the negative electrode 113B.

With the structure in which the positive electrode 113A and the negative electrode 113B are insulated from each other by the through-hole 113x, the functions of the nozzles 110A and 110B may be implemented by the single nozzle 113. The heating electrode 28E may be substantially circular in plan view, and the heating electrode 28F may be substantially annular in plan view. The nozzle 113 may not necessarily be configured such that the inner electrode is positive and the outer electrode is negative, and may be configured such that the inner electrode is negative and the outer electrode is positive. The positive electrode 113A may not necessarily be circularly cylindrical, and the negative electrode 113B may not necessarily be annular cylindrical.

Therefore, a nozzle having any desired shape may be used. In addition, a positive electrode and a negative electrode may be separate nozzles in accordance with the arrangement of heating electrodes, or a single nozzle including a positive electrode and a negative electrode may be used.

While exemplary embodiments and modifications thereof have been described in detail, the foregoing embodiments and modifications thereof are merely examples, and a variety of modifications and substitutions may be made to the foregoing embodiments and modifications thereof without departing from the scope defined by the appended claims.

For example, in the semiconductor device 10 illustrated in FIG. 1, the heating electrodes 28A and 28B are disposed on the sealing member 27. However, a portion or portions of the first principal surface of the wiring substrate 11 may be exposed from the sealing member 27, and the heating electrodes 28A and 28B may be disposed in the portion or portions of the first principal surface of the wiring substrate 11 which are exposed from the sealing member 27. The configurations illustrated in, for example, FIGS. 8 and 14 may also be modified in a similar manner.

In the foregoing embodiments and modifications thereof, a solder is used as an external connection terminal, by way of example. However, the external connection terminal is not limited to a solder as long as the external connection terminal is melted by being heated, and may be, for example, a conductive paste such as a silver paste.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component comprising:
    a wiring substrate having a first surface and a second surface;
    an electronic component body mounted on a first surface side of the wiring substrate;
    a plurality of external electrodes formed on a second surface side of the wiring substrate which is opposite to the first surface side, the external electrodes being electrically connected to the electronic component body, the external electrodes being connected to a substrate by solder;
    a heat generating member having a conductive property and having a higher resistivity than the external electrodes the heat generating member being formed in the same layer as a layer in which the external electrodes are formed;
    a heat insulating layer disposed between the electronic component body and the heat generating member, the heat insulating layer having an insulating property and being formed of a material different from an other material of the wiring substrate;
    a thermal diffusion layer to diffuse heat generated by the heat generating member, the thermal diffusion layer being disposed between the heat generating member and the heat insulating layer, the thermal diffusion layer having a higher thermal conductivity than the heat insulating layer, the thermal diffusion layer being provided adjacent to the heat generating member and the external electrodes, and the thermal diffusion layer being provided at a position overlapping the external electrodes; and
    a plurality of heating electrodes electrically connected, with through-wires, to ends of the heat generating member,
    wherein the through-wires are disposed in through-holes that extend through the wiring substrate from the first surface side to the second surface side, and through the heat insulating layer.

2. The electronic component according to claim 1, wherein the heat insulating layer is a layer adjacent to the thermal diffusion layer.

3. The electronic component according to claim 1, further comprising:
    a sealing member that seals the electronic component body; and
    a heating electrode connected to the heat generating member,
    wherein a portion of the heating electrode is formed on the first surface, and extends across a side surface of the sealing member and an upper surface of the sealing member from the first surface, and
    the heating electrode is electrically connected to the heat generating member through a through-wire extending through at least the heat insulating layer.

4. The electronic component according to claim 3, wherein the heating electrode is electrically connected to an end of the through-wire through a bonding wire.

5. The electronic component according to claim 1, further comprising:
    a sealing member that seals the electronic component body; and
    a heating electrode connected to the heat generating member,
    wherein the heating electrode is a portion of a lead terminal of the electronic component body, and
    the portion of the lead terminal extends to an upper surface of the sealing member.

6. The electronic component according to claim 1, wherein the heat generating member is configured in a meander pattern.

7. The electronic component according to claim 1, further comprising:
    a bump connected to the electronic component body; and
    an external connection terminal formed on the external electrode,
    wherein the bump is connected to the external connection terminal through the heat insulating layer, and the bump is formed of a solder material having a higher melting point than the external connection terminal.

* * * * *